United States Patent
Onobori et al.

(10) Patent No.: US 7,266,887 B2
(45) Date of Patent: Sep. 11, 2007

(54) SUBSTRATE TRANSPORTATION APPARATUS, COMPONENT MOUNTING APPARATUS AND SUBSTRATE TRANSPORTATION METHOD IN COMPONENT MOUNTING OPERATION

(75) Inventors: Shunji Onobori, Kyoto (JP); Shuichi Hirata, Osaka (JP); Satoshi Shida, Hirakata (JP); Akira Kugihara, Katano (JP); Yasuhiro Noma, Yao (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 141 days.

(21) Appl. No.: 10/535,238

(22) PCT Filed: Nov. 27, 2003

(86) PCT No.: PCT/JP03/15144

§ 371 (c)(1),
(2), (4) Date: May 17, 2005

(87) PCT Pub. No.: WO2004/052068

PCT Pub. Date: Jun. 17, 2004

(65) Prior Publication Data

US 2006/0048379 A1    Mar. 9, 2006

(30) Foreign Application Priority Data

Nov. 29, 2002 (JP) .............................. 2002-347755

(51) Int. Cl.
*H05K 3/30* (2006.01)

(52) U.S. Cl. .............................. 29/832; 29/564; 29/739; 29/740; 29/741; 29/840

(58) Field of Classification Search .................. 29/739, 29/740, 741, 832, 840, 564
See application file for complete search history.

(56) References Cited

U.S. PATENT DOCUMENTS

| | | | | |
|---|---|---|---|---|
| 3,473,212 | A * | 10/1969 | Beck et al. .................... | 29/705 |
| 5,461,324 | A * | 10/1995 | Boyette et al. ............. | 324/754 |
| 5,743,001 | A * | 4/1998 | Baker et al. .................. | 29/740 |
| 6,034,524 | A * | 3/2000 | Barringer et al. ........ | 324/158.1 |
| 6,425,477 | B1 * | 7/2002 | Karasawa .................... | 198/575 |
| 2003/0005885 | A1 * | 1/2003 | Mueller et al. ............. | 118/718 |
| 2004/0062633 | A1 * | 4/2004 | Rice et al. .................. | 414/935 |

FOREIGN PATENT DOCUMENTS

| | | |
|---|---|---|
| JP | 4-64300 | 2/1992 |
| JP | 7-303000 | 11/1995 |
| JP | 2001-24391 | 1/2001 |

* cited by examiner

*Primary Examiner*—Carl J. Arbes
(74) *Attorney, Agent, or Firm*—Wenderoth, Lind & Ponack, L.L.P.

(57) ABSTRACT

A component-mounted substrate moved to a specified substrate position by a substrate holding-and-moving device is delivered from a top of the substrate holding-and-moving device to a substrate discharge holder, and then while the substrate discharge holder is not moved, the substrate holding-and-moving device is moved to another substrate position, where a new substrate is received. Consequently, a later-executed movement operation for moving the new substrate to a substrate mounting region by the substrate holding-and-moving device, and a transfer operation for transferring the component-mounted substrate to an unloader unit by the substrate discharge holder, may be performed in parallel with each other without being influenced by each other's operation.

15 Claims, 14 Drawing Sheets

SUBSTRATE TRANSPORTATION APPARATUS, COMPONENT MOUNTING APPARATUS AND SUBSTRATE TRANSPORTATION METHOD IN COMPONENT MOUNTING OPERATION

TECHNICAL FIELD

The present invention relates to a substrate transportation apparatus for feeding substrates and discharging component-mounted substrates during a component mounting operation in which a plurality of components are mounted on substrates and the substrates are offered as the component-mounted substrates, a component mounting apparatus equipped with the substrate transportation apparatus, and a substrate transportation method of the component mounting operation.

BACKGROUND ART

Generally, this kind of component mounting apparatus has been known to have various structures. For instance, there is an apparatus with a structure as shown in FIG. 10 (see, e.g., Japanese unexamined patent publication No. H07-303000).

As shown in FIG. 10, an apparatus 231 is a component mounting apparatus for mounting components 232 such as bare IC chips onto substrates 233, and in a rear portion (back side) of a base 234 as viewed in this figure, there are provided a mounting head 235 for holding and mounting the components 232 onto the substrates 233, and an X-axis robot 236 which supports the mounting head 235 in such a way as to allow back-and-forth movement in an X-axis direction as viewed in the figure. On the base 234 below the X-axis robot 236, a slide table 237 movable in a Y-axis direction is located, and on the slide table 237, a holding base 238 for placing and holding the substrates 233 is located. Moreover, on the right-hand side of the base 234 in the X-axis direction as viewed in FIG. 10, a component feed device 249 which houses a plurality of components 232 in a feedable manner is located.

Moreover, in a front portion (near side) of the slide table 237 on the base 234 as viewed in FIG. 10, a substrate transportation apparatus 241 for transporting the substrates 233 along the X-axis direction as viewed in this figure is located. The substrate transportation apparatus 241 includes a loader 239 for transporting the substrates 233 from a right-side end portion of the base 234 along the X-axis direction as viewed in FIG. 10 to the slide table 237 and for loading the substrates 233 onto the holding base 238 on the slide table 237, and an unloader 240 for transporting the substrates 233 from the slide table 237 to a left-side end portion of the base 234 along the X-axis direction as viewed in this figure and for unloading the substrates 233 from the holding base 238 on the slide table 237.

Description will be given of a mounting operation performed in such a component mounting apparatus 231. A substrate 233 transported by the loader 239 is fed to the holding base 238 which is moved by the slide table 237 so as to be positioned between the loader 239 and the unloader 240, and is held by the holding base 238. Then, the substrate 233 held by the holding base 238 is moved by the slide table 237 so as to be positioned below the X-axis robot 236. At the same time, the component feed device 249 feeds a component 232 to the mounting head 235, and the mounting head 235 holding the component 232 is moved upward by the X-axis robot 236 for mounting the component 232 onto the substrate 233. Such mounting operation is repeated so as to mount a plurality of the components 232 onto the substrate 233. Then, the holding base 238 holding the substrate 233 with a plurality of components 232 mounted thereon is moved by the slide table 237 so as to be positioned between the loader 239 and the unloader 240, and the substrate 233 is transported and unloaded by the unloader 240.

Herein, a fragmentary enlarged cross sectional view showing a structure of the substrate transportation apparatus 241 in the component mounting apparatus 231 is shown in FIG. 11, and description is given of the structure with reference to FIG. 11.

As shown in FIG. 11, the loader 239 and the unloader 240 included in the substrate transportation apparatus 241 are respectively equipped with two transportation rails 239a and 240a for supporting respective end portions of the substrate 233 in the Y-axis direction as viewed in this figure in a transportable manner. Moreover, by the loader 239 and the unloader 240, the substrate 233 is transported in a substrate transportation direction A, which is a direction facing leftward in the X-axis direction as viewed in FIG. 11.

Further, as shown in FIG. 11, the substrate transportation apparatus 241 is equipped with a loading arm 242 for releasably holding the substrate 233 that is transported to the vicinity of end portions of the respective transportation rails 239a in the loader 239 on a side of substrate transportation direction A and for transferring the substrate 233 onto the holding base 238 positioned between the loader 239 and the unloader 240, and an unloading arm 243 for releasably holding the substrate 233 held on the holding base 238 in a state of being positioned at the aforementioned position and for transferring the substrate 233 to the vicinity of the end portions of the respective transportation rails 240a in the unloader 240 on a near-side of substrate transportation direction A. Moreover, the loading arm 242 and the unloading arm 243 are movable in an integrated state along the Y-axis direction as viewed in FIG. 11, and are also movable separately in a vertical direction.

Next description discusses feed and discharge operations of the substrate 233 onto/from the holding base 238 in thus-structured substrate transportation apparatus 241.

First, FIG. 12A, FIG. 12B, FIG. 12C and FIG. 12D show schematic explanatory views of the feed and discharge operations. It is to be noted that in FIG. 12A to FIG. 12D, a newly fed substrate 233 is referred to as substrate 233A, and a component-mounted substrate 233 is referred to as substrate 233B.

As shown in FIG. 12A, in the component mounting apparatus 231, upon completion of a mounting operation of component 232, substrate 233B with the component 232 mounted thereon is moved with the holding base 238 to between the loader 239 and the unloader 240 by the slide table 237, while substrate 233A on which a next component 232 is mounted is transported in substrate transportation direction A by the loader 239. Then, the loading arm 242 and the unloading arm 243 are moved along substrate transportation direction A so that the loading arm 242 is positioned above the substrate 233A and the unloading arm 243 is positioned above the substrate 233B, and after being moved, the loading arm 242 is moved downward to hold the substrate 233A, while the unloading arm 243 is moved downward to hold the substrate 233B.

Next, as shown in FIG. 12B, the loading arm 242 is moved upward in a state of holding the substrate 233A, while the unloading arm 243 is moved upward in a state of holding the substrate 233B. Then, as shown in FIG. 12C, the loading arm 242 and the unloading arm 243 are moved in substrate transportation direction A, so that the substrate 233A held by the loading arm 242 is positioned above a holding base 238 and the substrate 233B held by the unloading arm 243 is positioned above the vicinity of an end portion of the unloader 240. It is to be noted that at this point, the component 232 is mounted on the substrate 233B, and so a movement speed during this movement is set to be a speed which prevents this mounted component 232 from being displaced from its mounted position by vibration and the like generated during the movement, i.e., a speed lower than a normal movement speed.

Then, as shown in FIG. 12D, a downward movement operation of the loading arm 242 and the unloading arm 243 is performed to transfer the substrate 233A onto an upper surface of the holding base 238, while the substrate 233B is transferred to the unloader 240. Then, the loading arm 242 is released from the state of holding the substrate 233A and the loading arm 242 is moved upward, while the unloading arm 243 is released from the state of holding the substrate 233B and the unloading arm 243 is moved upward. After that, the substrate 233B is transported in the substrate transportation direction and discharged from the component mounting apparatus 231 by the unloader 240. At the same time, the holding base 238 that held the substrate 233A is moved by the slide table 237, and a mounting operation for mounting each component 232 on the substrate 233A is started.

Further, a timing chart for such feed and discharge operations of the substrate 233 is shown in FIG. 13. FIG. 13 shows a time relationship among execution/stoppage of the component mounting operation, execution/stoppage of the movement operation of the slide table 237, respective vertical movement height positions of the loading arm 242 and the unloading arm 243, execution/stoppage of the holding operation of the substrate 233 by the loading arm 242 and the unloading arm 243, and execution/stoppage of the movement operation of the loading arm 242 and the unloading arm 243 along substrate transportation direction A. Moreover, respective time points T1 through T10 represent significant time points of respective operations. As shown in FIG. 13, time points T3 to T4 indicate the state in FIG. 12A, time point T5 indicates the state in FIG. 12B, time point T6 indicates the state in FIG. 12C, and time points T7 to T8 indicate the state in FIG. 12D.

SUMMARY OF THE INVENTION

However, during such feed and discharge operations of the substrate 233 by the component mounting apparatus 231, the substrate 233B with the component 232 mounted thereon needs to be moved by the unloading arm 243 during time points T5 and T6 shown in FIG. 13, and since the movement speed is limited to a low rate as described above, the time period between time points T5 and T6 is prolonged. Thus-prolonged time period between time points T5 and T6 directly affects a time period during which the mounting operation of the component 232 is stopped for feeding and unloading the substrate 233, i.e., a time period between time points T1 and T10, thereby causing a problem that stoppage time of the mounting operation is prolonged. Such a problem is a major element that hinders increase in productivity in the component mounting operation of the component mounting apparatus 231.

Accordingly, in order to solve the problems noted above, an object of the present invention is, during a substrate transportation operation for feeding substrates and discharging component-mounted substrates during a component mounting operation in which a plurality of components are mounted on a substrate and the substrate is offered as a component-mounted substrate, to provide a substrate transportation apparatus capable of decreasing an influence of time necessary for feeding and discharging the substrate on stoppage time of the mounting operation for mounting respective components so as to increase productivity, a component mounting apparatus equipped with the substrate transportation apparatus, and a substrate transportation method of the component mounting operation.

In order to accomplish the above-stated objects, the present invention is constituted as described below.

According to a first aspect of the present invention, there is provided a substrate transportation apparatus for transporting substrates by feeding substrates to a component mounting apparatus which mounts a plurality of components onto the substrates and offers the substrates as component-mounted substrates, and by discharging the component-mounted substrates from the component mounting apparatus, comprising:

a loader unit for loading a substrate along a substrate-transportation direction so that the substrate (on which respective components should be mounted in the component mounting apparatus) is positioned in a first substrate position out of the first substrate position, a second substrate position, a third substrate position and a fourth substrate position, each of which is arranged sequentially next to each other;

an unloader unit for unloading a substrate positioned at the fourth substrate position from the fourth substrate position (so as to discharge the substrate from the component mounting apparatus);

a substrate feed holder for releasably holding a substrate positioned at the first substrate position and then transferring the substrate to the second substrate position;

a substrate discharge holder for releasably holding a substrate positioned at the third substrate position and then transferring the substrate to the fourth substrate position;

a holder moving unit for moving the substrate feed holder and the substrate discharge holder in a vertical direction and along the substrate-transportation direction; and a substrate holding-and-moving device for releasably holding a substrate and moving this held substrate to a substrate mounting region in which component mounting in the component mounting apparatus is performed, and for being moved to the second substrate position and to the third substrate position, respectively.

According to a second aspect of the present invention, there is provided the substrate transportation apparatus as defined in the first aspect, further comprising a control unit which is operable to control respective holding operations of the substrate feed holder and the substrate discharge holder, a movement operation of the holder moving unit and a movement operation of the substrate holding-and-moving device, and which controls respective operations such as: holding, by the substrate discharge holder, a component-mounted substrate on the substrate holding-and-moving device positioned at the third substrate position; discharging the component-mounted substrate from the substrate holding-and-moving device; moving the substrate holding-and-moving device to the second substrate position; feeding, by the substrate feed holder, the substrate to the substrate holding-and-moving device; moving the substrate holding-and-moving device, to which the substrate has been fed, to the substrate mounting region; and moving the component-mounted substrate held by the substrate discharge holder to the fourth substrate position.

According to a third aspect of the present invention, there is provided the substrate transportation apparatus as defined in the first aspect, wherein the substrate holding-and-moving device is operable to move the held substrate in a direction along the substrate-transportation direction, which is a direction along a surface of the substrate, and in a direction almost perpendicular to the transportation direction.

According to a fourth aspect of the present invention, there is provided the substrate transportation apparatus as defined in the first aspect, wherein the holder moving unit is operable to switch a speed or an acceleration thereof depending on whether or not the substrate discharge holder is in a state of holding a component-mounted substrate, wherein a speed or an acceleration of the substrate discharge holder when the substrate discharge holder is in this holding state is smaller than a speed or an acceleration of the substrate discharge member when the substrate discharge holder is not in the holding state.

According to a fifth aspect of the present invention, there is provided the substrate transportation apparatus as defined in the fourth aspect, wherein the speed of the substrate discharge holder when the substrate discharge holder is in the holding state is a speed which allows to be prevented components, mounted on the component-mounted substrate, from suffering displacement from mounted positions.

According to a sixth aspect of the present invention, there is provided the substrate transportation apparatus as defined in the first aspect, wherein the first substrate position and the fourth substrate position share an identical height position, and the second substrate position and the third substrate position share an identical height position.

According to a seventh aspect of the present invention, there is provided the substrate transportation apparatus as defined in the sixth aspect, wherein the holder moving unit comprises:
  a feed elevation unit for vertically moving the substrate feed holder; and
  a discharge elevation unit for vertically moving the substrate discharge holder,
wherein these respective elevation units are operable to move each of the substrate feed holder and the substrate discharge holder vertically, so that the substrate feed holder and the substrate discharge holder are separately positioned at each of a first height position which is a height of the first substrate position and the fourth substrate position, a first retreat height position higher than the first height position, a second height position which is a height position of the second substrate position and the third substrate position, and a second retreat height position higher than the second height position.

According to an eighth aspect of the present invention, there is provided the substrate transportation apparatus as defined in the seventh aspect, wherein the respective elevation units include two cylinder sections whose strokes are different from each other, with the strokes of these respective cylinder sections being combined to achieve vertical movement to respective height positions.

According to a ninth aspect of the present invention, there is provided a component mounting apparatus, comprising:
  the substrate transportation apparatus as defined in any one of the first aspect to the eight aspect; and
  a mounting head unit for holding respective components and mounting these held components onto a substrate held by the substrate holding-and-moving device in the substrate mounting region.

According to a tenth aspect of the present invention, there is provided a substrate transportation method of a component mounting operation for positioning substrates placed and held on a substrate holding base at a substrate mounting region, and mounting a plurality of components onto the substrates so as to offer the substrates as component-mounted substrates, in which the substrates are fed and discharged by using a substrate feed holder for releasably holding the substrates transported along a substrate-transportation direction and feeding the substrates to the substrate holding base, and a substrate discharge holder for holding the component-mounted substrates held on the substrate holding base and discharging the substrates from the substrate holding base so as to put the substrates in a state transportable along the transportation direction, comprising:

holding, by the substrate feed holder, a substrate transported along the transportation direction to a first substrate position out of the first substrate position, a second substrate position, a third substrate position and a fourth substrate position, each of which is arranged sequentially next to each other, and then positioning this held substrate at a height position located above the second substrate position, while positioning the substrate discharge holder at a height position located above the third substrate position;

moving the substrate holding base, which is holding a component-mounted substrate in the substrate mounting region, to the third substrate position;

discharging the substrate from the substrate holding base, by moving the substrate discharge holder downward, holding the component-mounted substrate, and moving the component-mounted substrate upward to a higher height position;

then moving the substrate holding base to the second substrate position;

feeding the substrate to the substrate holding base, by moving the substrate feed holder downward, and releasing a holding state; and moving the substrate holding base to which the substrate has been fed to the substrate mounting region, while moving the component-mounted substrate held by the substrate discharge holder to the fourth substrate position.

According to an eleventh aspect of the present invention, there is provided the substrate transportation method of a component mounting operation as defined in the tenth aspect, wherein a movement operation for moving the component-mounted substrate held by the substrate discharge holder to the fourth substrate position is completed after a mounting operation for mounting components onto the substrate fed to the substrate holding base is started in the substrate mounting region.

According to a twelfth aspect of the present invention, there is provided the substrate transportation method of a component mounting operation as defined in the tenth aspect, wherein a speed or an acceleration of the component-mounted substrate held by the substrate discharge holder to the fourth substrate position is less than a speed or an acceleration of the substrate discharge holder when the substrate discharge holder is not in a state of holding a component-mounted substrate.

According to a thirteenth aspect of the present invention, there is provided the substrate transportation method of a component mounting operation as defined in the tenth aspect, wherein timing control is performed to hold, by the substrate feed holder, the substrate transported to the first substrate position so that almost as soon as the substrate holding base holding the component-mounted substrate is moved to and positioned at the third substrate position, the substrate feed holder holding the substrate and the substrate discharge holder are moved to and positioned at a height position at which the substrate holding base positioned at the third substrate position is avoidable.

According to a fourteenth aspect of the present invention, there is provided the substrate transportation method of a component mounting operation as defined in any one of the tenth aspect to the thirteenth aspect, wherein timing control is performed to hold, by the substrate feed holder, the substrate transported to the first substrate position based on a time necessary for mounting respective components onto the substrate positioned in the substrate mounting region and offering the substrate as a component-mounted substrate and a time necessary for holding, by the substrate feed holder, the substrate transported to the first substrate position and positioning this held substrate at a height position higher than the second substrate position.

According to the first aspect, the second aspect or the tenth aspect of the present invention, in the substrate transportation apparatus, when a component-mounted substrate is discharged, a mounting operation for mounting respective components onto a newly fed substrate is put in an executable state independently of and in parallel with an operation to move the component-mounted substrate to the unloader unit by the substrate discharge holder. Therefore, with a component mounting apparatus equipped with the substrate transportation apparatus, it becomes possible in the component mounting apparatus to reduce an influence of an operation for discharging component-mounted substrates on stoppage time of the mounting operation for mounting components on newly fed substrates, by which stoppage time of the mounting operation for mounting the components may be shortened, and productivity of the mounting operation of the components may be enhanced.

More specifically, after the component-mounted substrate moved to the third substrate position by the substrate holding-and-moving device is delivered from on the substrate holding-and-moving device to the substrate discharge holder, the substrate discharge holder is not moved while the substrate holding-and-moving device is moved to the second substrate position so as to be able to receive a new substrate at the second substrate position. Eventually, an operation which is executed thereafter, i.e., a movement operation for moving the new substrate to the substrate mounting region by the substrate holding-and-moving device, and a transfer operation for transferring the component-mounted substrate to the unloader unit by the substrate discharge holder may be respectively performed in parallel with each other without being influenced by each other's operation. This make is possible to solve a problem, as shown in the component mounting apparatus equipped with a conventional substrate transportation apparatus, that the movement operation for moving the new substrate to the substrate mounting region by the substrate holding-and-moving device is limited by the transfer operation for transferring the component-mounted substrate to the unloader unit by the substrate discharge holder. Therefore, it becomes possible to shorten a stoppage time of the mounting operation of the components in order to feed and discharge the substrates in the component mounting apparatus, thereby making it possible to provide a substrate transportation apparatus capable of enhancing productivity of the component mounting apparatus.

According to the third aspect of the present invention, the substrate transportation apparatus is provided with the substrate holding-and-moving device which is capable of holding the substrate and which is capable of moving this held substrate in a direction along the substrate-transportation direction, in a direction along the surface of the substrate, and in a direction almost perpendicular to the transportation direction. This allows selective movement of the substrate to the substrate mounting region, the second substrate position and the third substrate position, thereby making it possible to achieve the aforementioned effects.

According to the fourth aspect, the fifth aspect or the twelfth aspect of the present invention, the holder moving unit may switch a speed or an acceleration (hereinbelow referred to as a speed or the like) thereof depending on whether or not the substrate discharge holder is in a state of holding a component-mounted substrate. The speed or the acceleration of the substrate discharge holder when the component-mounted substrate is in a held state is set lower (smaller) than a speed or acceleration of the substrate discharge holder when the component-mounted substrate is not in the held state, by which, during a movement operation for moving the component-mounted substrate to the unloader unit by the substrate discharge holder, it becomes possible to prevent respective mounted components from being displaced from mounted positions due to vibration and the like generated by such movement, thereby allowing execution of a discharge operation of the substrate while quality of the component mounting apparatus is maintained.

Particularly, such a movement operation for moving the component-mounted substrate by the substrate discharge holder at a slow speed or acceleration can be performed independently of and in parallel with a mounting operation for mounting components onto a newly fed substrate, which makes effects by these respective aspects more efficient.

According to the sixth aspect of the present invention, in addition to the effects by other respective aspects, it further becomes possible to easily move the substrate holding-and-moving device, which has delivered the component-mounted substrate to the substrate discharge holder at the third substrate position, from the third substrate position to the second substrate position for receiving a new substrate from the substrate feed arm at the second substrate position because the second substrate position and the third substrate position share an identical height position. Moreover, since the first substrate position and the fourth substrate position share an identical height position, the substrate feed arm and the substrate discharge arm can share the same structure.

According to the seventh aspect of the present invention, respective height positions during vertical movement of the substrate feed holder and the substrate discharge holder are controllable to four level height positions. Consequently, compared to, for example, a case where vertical movement is controllable only to two level height positions, it becomes possible, through execution of vertical movement in a phased manner, to prolong a time period during which a vertical movement operation can be performed in parallel with other operations such as a movement operation of the substrate holding-and-moving device, thereby making it possible to reduce time necessary for a practical vertical movement operation. This allows substantial reduction of time necessary for feed and discharge operations of substrates, allows reduction in a stoppage time of the component mounting operation in order to feed and discharge substrates, and further allows increase in productivity in the component mounting operation.

According to the eighth aspect of the present invention, the respective elevation units have two cylinder sections whose strokes are different from each other, and therefore the strokes of these respective cylinder sections may be combined to achieve vertical movement of the substrate feed holder and the substrate discharge holder to each of the four level height position.

According to the eleventh aspect of the present invention, the movement operation for moving the component-mounted substrate held by the substrate discharge holder to the fourth substrate position, i.e., the transfer operation to the unloader unit, is completed after the mounting operation for mounting the components onto the substrate fed to the substrate holding base is started in the substrate mounting region. This makes it possible to reduce a stoppage time of the mounting operation of the components for the discharge operation of component-mounted substrates, thereby making it possible to provide a substrate transportation method capable of enhancing productivity during the component mounting operation.

According to the twelfth aspect or the thirteenth aspect of the present invention, in addition to the effects by other respective aspects, it becomes possible to perform more efficient transportation of the substrates, thereby making it possible to provide a substrate transportation method capable of enhancing productivity during the component mounting operation.

BRIEF DESCRIPTION OF DRAWINGS

These and other objects and features of the present invention will become apparent from the following description taken in conjunction with preferred embodiments of the invention with reference to the accompanying drawings, in which.

DETAILED DESCRIPTION OF THE PREFERRED EMBODIMENTS

Figure 1:
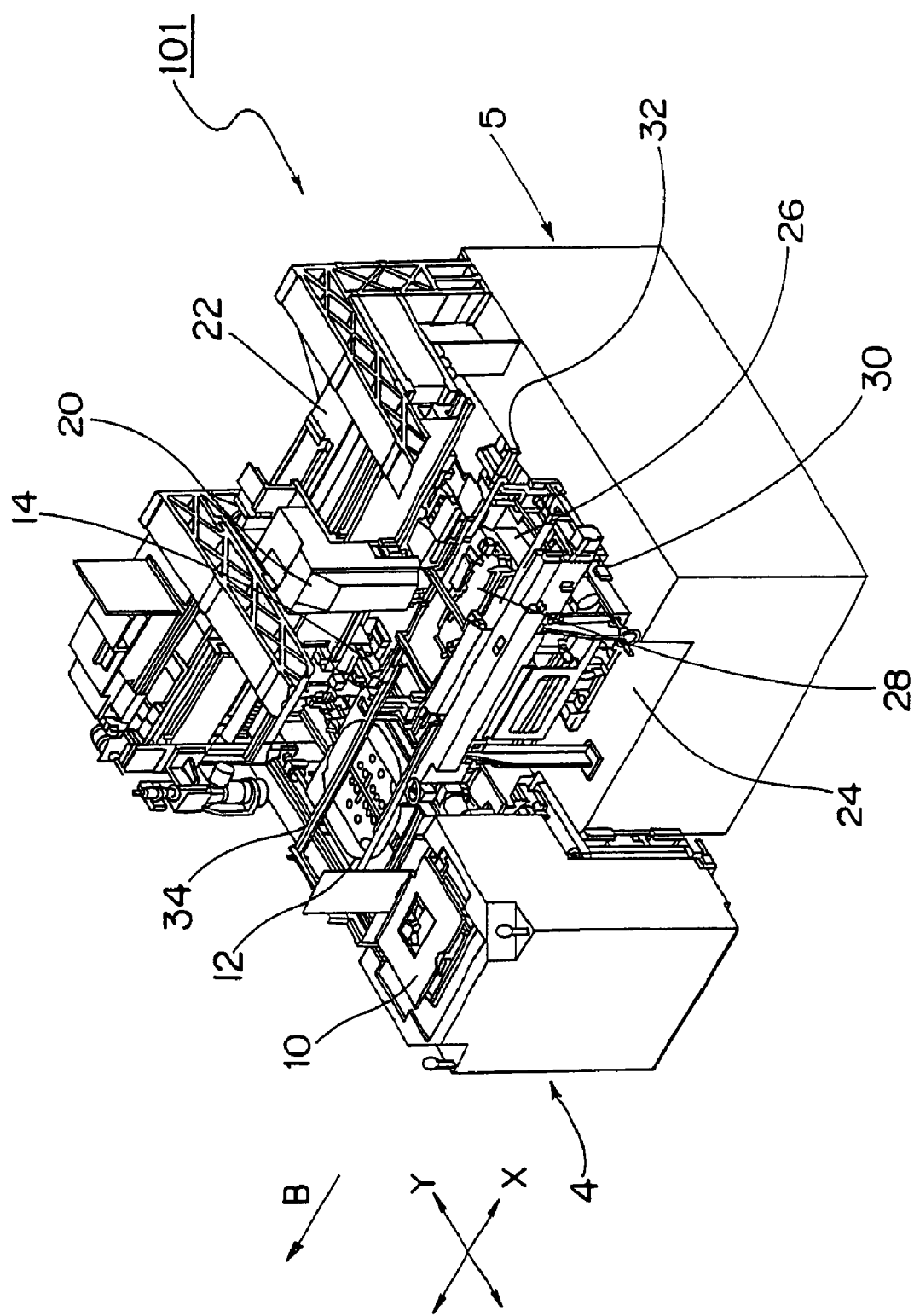
FIG. 1 is a perspective view showing an electronic component mounting apparatus according to one embodiment of the present invention.

Before description of the present invention proceeds, it is to be noted that like parts are designated by like reference numerals throughout the accompanying drawings.

Hereinbelow, embodiments of the present invention will be described in detail with reference to the drawings.

EMBODIMENTS

FIG. 1 is a perspective view showing an electronic component mounting apparatus 101 exemplifying a component mounting apparatus equipped with a substrate transportation apparatus in one embodiment of the present invention.

As shown in FIG. 1, the electronic component mounting apparatus 101, which is an apparatus that performs a mounting operation for mounting electronic components 2, such as chip components and bare IC chips exemplifying components, onto a substrate 3, is mainly composed of a component feed device 4 for housing a plurality of the electronic components 2 in a feedable manner, and a mounting device 5 which performs a mounting operation for mounting each electronic component 2, fed from the component feed device 4, onto the substrate 3.

In the component feed device 4 shown in FIG. 1, on a near side of the component feed device 4 in a Y-axis direction as viewed in this figure, a lifter unit 10, for housing a semiconductor wafer with a number of electronic components 2 formed thereon or housing a component tray housing a number of electronic components 2 placed in a matrix structure, is located in a manner allowing selective feeding.

Further, the component feed device 4 includes a feed component displacement base 12 for placing the semiconductor wafer or the component tray selectively fed from the lifter unit 10 and offering the electronic components 2 in a state removable therefrom. It is to be noted that in a case where the semiconductor wafer is fed from the lifter unit 10, the semiconductor wafer is subjected to an expansion operation on the feed component displacement base 12.

Further, the component feed device 4 includes an inverting head unit 14 which separately sucks and holds the electronic components 2 from the semiconductor wafer or the component tray selectively placed on the feed component displacement base 12 so as to move the electronic components 2 toward the mounting device 5 along an X-axis direction as viewed in FIG. 1 and which inverts these sucked and held electronic components 2 in a vertical direction.

Further, as shown in FIG. 1, the mounting device 5 includes a mounting head unit 20 for sucking and holding the electronic components 2 and mounting them on the substrate 3. The mounting device 5 further includes an X-axis robot 22, exemplifying a movement device, for supporting and moving the mounting head unit 20 back and forth along the X-axis direction as viewed in FIG. 1, between a component feed position at which the electronic components 2 held by the inverting head unit 14 can be delivered to the mounting head unit 20, and a substrate mounting region in which the mounting operation for mounting the electronic components 2 onto the substrate 3 are performed, both of which are located along the X-axis direction as viewed in this figure.

It is to be noted that the mounting head unit 20 may be driven to be moved in a vertical direction by a movement device such as a voice coil motor, and has a holding unit (unshown) structured so as to impart junction energy such as pressure energy, supersonic vibration energy and thermal energy to a junction portion between the electronic components 2 and the substrate 3 via the sucked and held electronic components 2, which makes it possible to impart the junction energy while the electronic components 2 are pressed against the substrate 3. Further, the X-axis robot 22 includes a movement mechanism (unshown) with use of, for example, a ball screw axis section and a nut section engaged with the ball screw axis section.

Further, as shown in FIG. 1, on a base 24 in the mounting device 5 below the mounting head unit 20 and the X-axis robot 22, there is located an XY table 26 which can move the substrate 3 in the X-axis direction and Y-axis direction as viewed in this figure, and which aligns the mounting head unit 20 with positions of the electronic components 2 to be mounted on the substrate 3. The XY table 26 is driven to be moved in the X-axis direction and the Y-axis direction as viewed in FIG. 1 by, for example, a servomotor, and can perform alignment by full close control with use of a linear scale. Further, on an upper surface of the XY table 26, a substrate support base 28 for releasably holding and fixing the substrate 3 is located. It is to be noted that in FIG. 1, the X-axis direction and the Y-axis direction are directions which are along a surface of the substrate 3 and which are perpendicular to each other.

As shown in FIG. 1, the electronic component mounting apparatus 101 is further composed of a substrate transportation apparatus 30 in an end portion of an upper surface of the base 24 on a near side in the Y-axis direction as viewed in this figure for transporting the substrate 3 along a substrate transportation direction B, that is a direction facing leftward in the X-axis direction as viewed in the figure, and for feeding the substrate 3 to the substrate holding base 28 and discharging the substrate 3 from the substrate holding base 28. The substrate transportation apparatus 30 is composed of a loader 32, exemplifying a loader unit, for loading and feeding substrates 3 from a right-side end portion of the electronic component mounting apparatus 101 in the X-axis direction as viewed in FIG. 1 to the substrate holding base 28 on the XY table 26, and an unloader 34, exemplifying an unloader unit, for unloading the substrates 3 from the substrate holding base 28 to a left-side end portion of the electronic component mounting apparatus 101 in the X-axis direction as viewed in this figure and discharging the substrates 3 therefrom. It is to be noted that the present embodiment is an example in which the XY table 26 in the electronic component mounting apparatus 101 is also used as a substrate holding-and-moving device included in the substrate transportation apparatus 30. Moreover, the XY table 26 and the substrate support base 28 exemplify a substrate holding-and-moving device which moves and holds the substrate 3 as described above. Further, instead of such a case where such combined use is adopted, a substrate holding-and-moving device may be provided in the substrate transportation apparatus 30 independently of the XY table 26 in the electronic component mounting apparatus 101.

Next, description is given of a mounting operation for mounting the electronic components 2 onto the substrate 3 in the electronic component mounting apparatus 101 having such a structure.

In the electronic component mounting apparatus 101 in FIG. 1, the substrate holding base 28 is moved by the XY table 26 so as to be positioned between the loader 32 and the unloader 34 on the base 24. At the same time, a substrate 3 onto which respective electronic components 2 should be mounted in the electronic component mounting apparatus 101 is fed from, for example, another apparatus or the like which is adjacent to the electronic component mounting apparatus 101, to the loader 32 in the substrate transportation apparatus 30. The substrate 3 is transported by the loader 32 in substrate transportation direction B and the substrate 3 is fed to and held on the substrate holding base 28. Then, the XY table 26 is moved in the X-axis direction or the Y-axis direction as viewed in FIG. 1, by which the substrate 3 is moved to the substrate mounting region.

Meanwhile, an electronic component 2 removed in a state of being sucked and held by the inverting head unit 14 in the component feed device 4 is inverted and moved to a component feed position. Moreover, the mounting head unit 20 is moved to the component feed position by the X-axis robot 22 in the mounting device 5, and the electronic component 2 is delivered from the inverting head unit 14 to the mounting head unit 20. Then, the mounting head unit 20, in a state of sucking and holding delivered electronic component 2, is moved toward above the substrate mounting region by the X-axis robot 22.

Then, alignment of the electronic component 2 sucked and held by the mounting head unit 20 with a position at which the electronic component 3 should be mounted onto the substrate 3 held by the substrate holding base 28 is executed by movement of the XY table 26. After this alignment operation, a vertical movement operation or the like of the mounting head unit 20 is performed so as to execute the mounting operation for mounting the electronic component 2 onto the substrate 3. In a case where a mounting operation of a plurality of the electronic components 2 is performed, the aforementioned respective operations are repeatedly conducted to achieve the mounting operation of a plurality of the electronic components 2.

Then, upon completion of the mounting operation of respective electronic components 2, the substrate 3 with the respective electronic components 2 being mounted thereon is moved together with the substrate holding base 28 to a position between the loader 32 and the unloader 34 by the XY table 26, the substrate 3 is delivered from the substrate holding base 28 to the unloader 34, the substrate 3 is transported along substrate transportation direction B by the unloader 34, and the substrate 3 is discharged from the electronic component mounting apparatus 101. This discharged substrate 3 is fed to, for example, another apparatus disposed adjacent the electronic component mounting apparatus 101 for performing a processing sequence in addition to the component mounting operation and the like, or is housed as a component-mounted substrate 3 in a substrate housing apparatus and the like.

Thus, in the electronic component mounting apparatus 101, the mounting operation for mounting the respective electronic components 2 onto the substrate 3 is conducted. It is to be noted that after the substrate 3 with the respective electronic components 2 being mounted thereon is discharged by the unloader 34, another new substrate 3 is fed by the loader 32 so that respective electronic components 2 are mounted on respective substrates 3 that are to be fed in sequence.

Next, a detailed structure of the substrate transportation apparatus 30 in such an electronic component mounting apparatus 101 will be described. It is to be noted that FIG. 2 is a fragmentary enlarged perspective view showing the substrate transportation apparatus 30.

Figure 2:
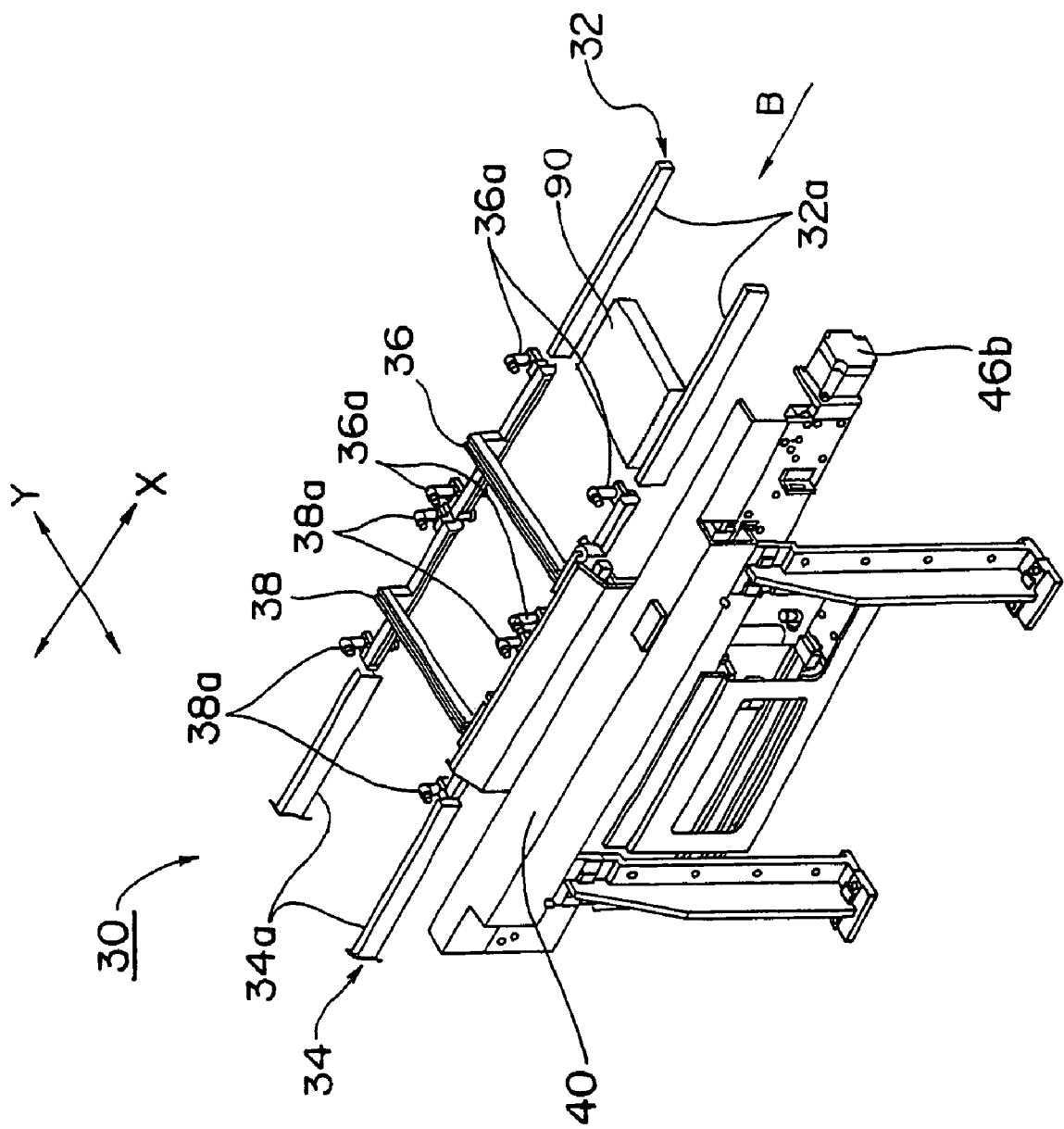
FIG. 2 is a fragmentary enlarged perspective view showing a substrate transportation apparatus of the electronic component mounting apparatus of FIG. 1.

As shown in FIG. 2, the loader 32 and the unloader 34 included in the substrate transportation apparatus 30 are respectively composed of two transportation rails 32a and 34a, which support respective end portions of the substrate 3 in the Y-axis direction as viewed in this figure in a transportable manner. Consequently, in the loader 32, the substrate 3 can be transported in substrate transportation direction B while both ends portion thereof are supported by respective transportation rails 32a, and also in unloader 34, the substrate 3 can be transported in substrate transportation direction B while both ends portion thereof are supported by respective transportation rails 34a.

Moreover, as shown in FIG. 2, the substrate transportation apparatus 30 is equipped with a loading arm 36, which exemplifies a substrate feed holder, for releasably holding the substrate 3 that is transported to the vicinity of the end portions of the transportation rails 32a in the loader 32 on a side of substrate transportation direction B, and for transferring and feeding the substrate 3 onto the substrate holding base 28 positioned between the loader 32 and the unloader 34. The substrate transportation apparatus 30 is also equipped with an unloading arm 38, that exemplifies a substrate discharge holder, for releasably holding the substrate 3 held on the substrate holding base 28 positioned at the aforementioned position, and for transferring the substrate 3 to the vicinity of the end portions of the transportation rails 34a in the unloader 34 on a near-side of substrate transportation direction B and discharging the substrate 3 therefrom. Moreover, the loading arm 36 and the unloading arm 38 are movable in an integrated state along substrate transportation direction B, and are also movable separately in a vertical direction. The substrate transportation apparatus 30 is provided with an arm movement unit 40, that exemplifies a holder moving unit, for performing such movement and vertical movement operation of the loading arm 36 and the unloading arm 38.

As shown in FIG. 2, the loading arm 36 and the unloading arm 38 share the same structure, in which in respective lower parts of four end portions in arm sections formed into an almost planar H shape from rod articles, holding nozzles 36a and 38a, for releasably sucking and holding a surface of the substrate 3, are provided. These respective holding nozzles 36a and 38a are located in the arm sections (i.e., the rod articles) so as to be able to suck and hold the vicinity of respective corner portions of the surface of the substrate 3 having an almost square shape, which allows stable and reliably holding of the substrate 3.

Figure 3:
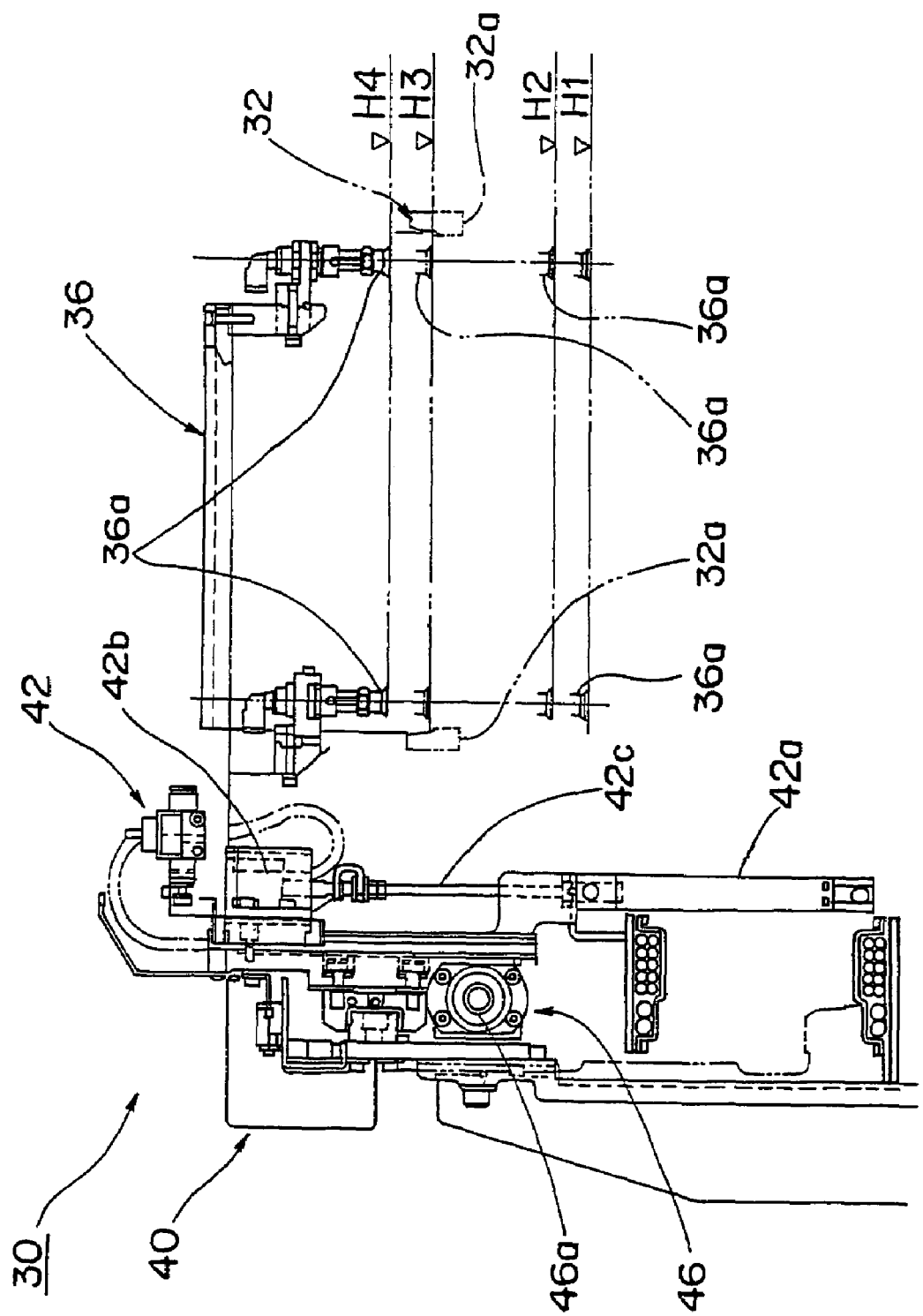
FIG. 3 is a fragmentary cross sectional view showing the substrate transportation apparatus of FIG. 2.
Figure 9:
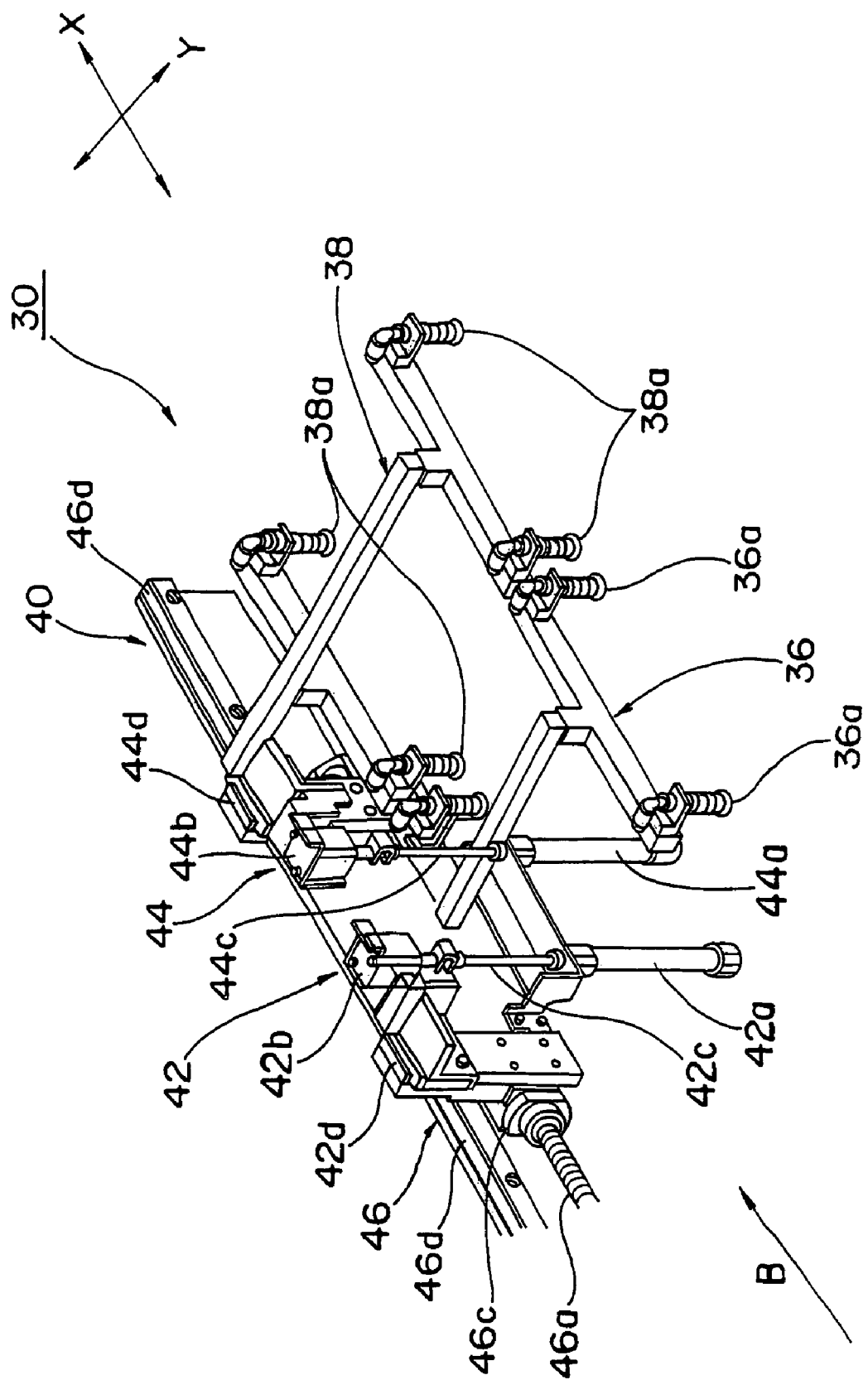
FIG. 9 is a fragmentary enlarged perspective view showing the substrate transportation apparatus of FIG. 2.
Figure 10:
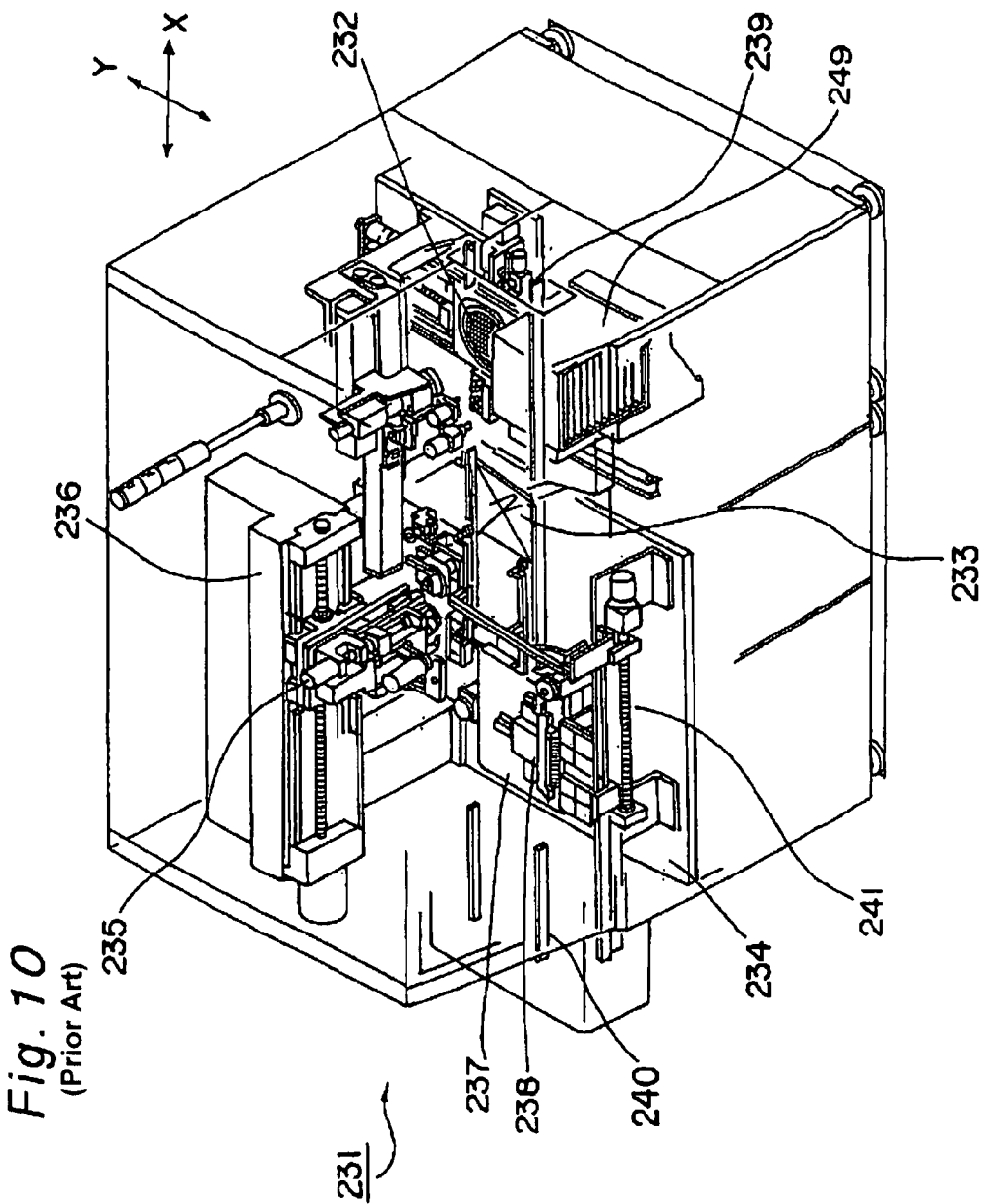
FIG. 10 is a perspective view showing a conventional component mounting apparatus.
Figure 11:
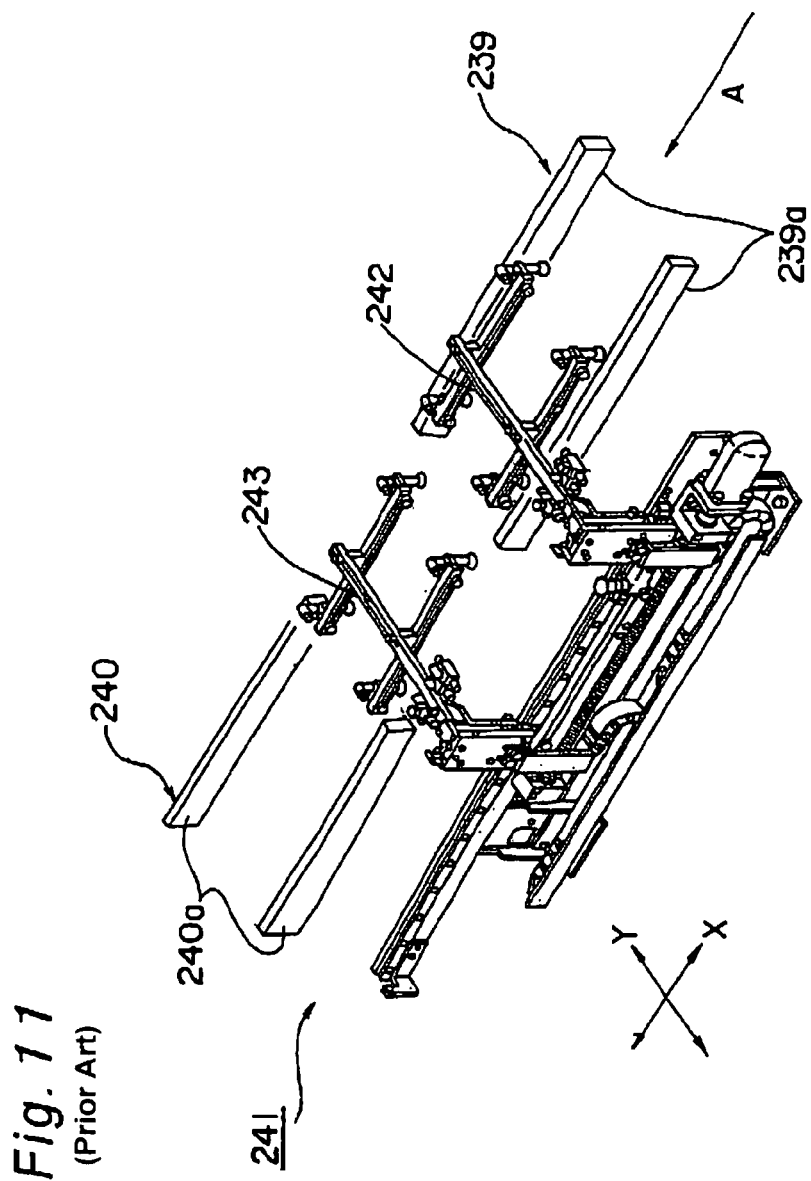
FIG. 11 is a perspective view showing a substrate transportation apparatus in the conventional component mounting apparatus.
Figure 12A:
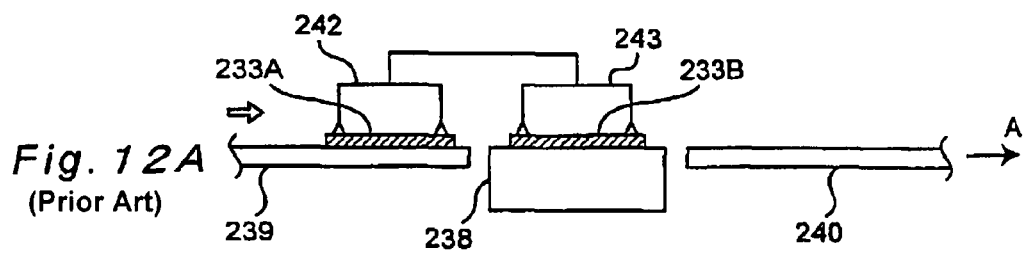
FIG. 12A, FIG. 12B, FIG. 12C and FIG. 12D are, respectively, schematic explanatory views showing respective operations for feeding and discharging substrates in the conventional component mounting apparatus.
Figure 12B:
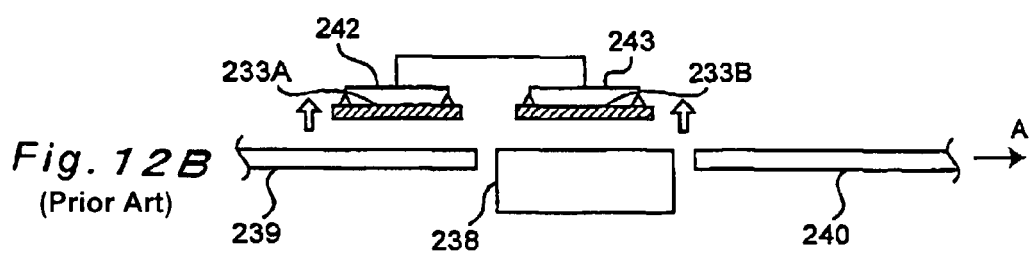
Figure 12C:
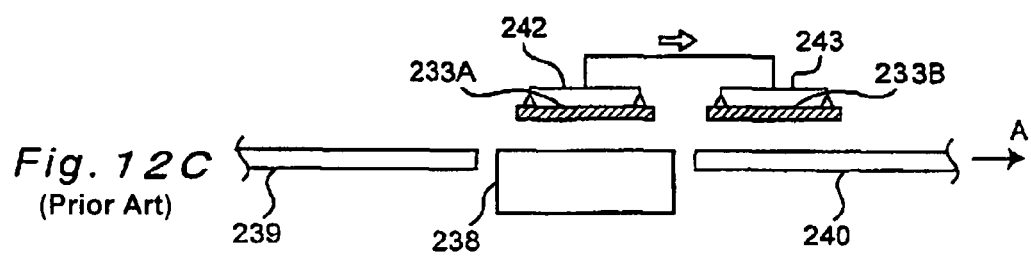
Figure 12D:
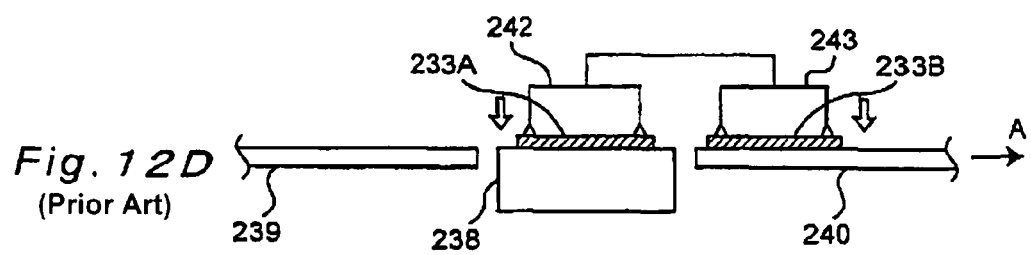
Figure 13:
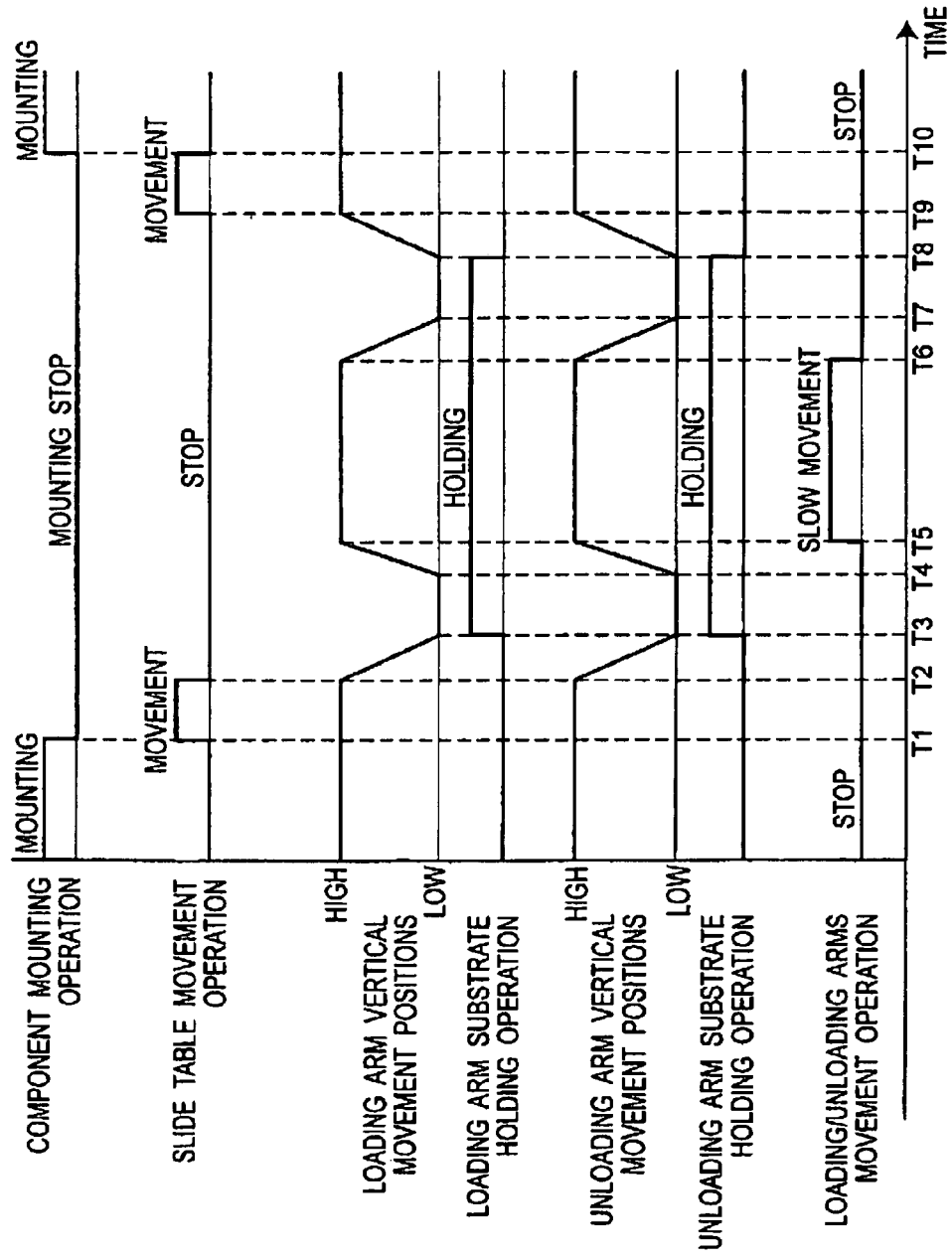
FIG. 13 is a timing chart showing respective operations for feeding and discharging substrates in the conventional component mounting apparatus.

Herein, a fragmentary cross sectional view along a cross section of the substrate transportation apparatus 30 orthogonal to substrate transportation direction B is shown in FIG. 3, and a fragmental enlarged perspective view of the substrate transportation apparatus 30 is shown in FIG. 9. As shown in FIG. 3, the respective holding nozzles 36a and 38a of the aforementioned loading arm 36 and the unloading arm 38 are located in the vicinity of an inside of the transportation rails 32a and 34a in a planar manner.

Further, as shown in FIG. 3 and FIG. 9, the arm movement unit 40 is composed of a loading arm elevation unit 42, that exemplifies a feed elevation unit, for performing a vertical movement operation of the loading arm 36, an unloading arm elevation unit 44, that exemplifies a discharge elevation unit, for performing a vertical movement operation of the unloading arm 38, and a substrate transportation direction movement unit 46 for performing movement of the loading arm 36 and the unloading arm 38. It is to be noted that the loading arm elevation unit 42 and the unloading arm elevation unit 44 share the same structure, and therefore description is given only for the loading arm elevation unit 42 as a representative example. It is to be noted that in FIG. 3, only the loading arm elevation unit 42 is illustrated.

As shown in FIG. 3 and FIG. 9, the loading arm elevation unit 42 is composed of a long cylinder section 42a disposed on a lower side as viewed in these figures, and a short cylinder section 42b located on an upper side as viewed in the figures, as two cylinder sections whose stroke lengths are different from each other. Moreover, the long cylinder section 42a and the short cylinder section 42b are located such that motion axes of respective strokes are aligned in an almost perpendicular direction relative to substrate transportation direction B, with a piston (unshown) incorporated in the long cylinder section 42a and a piston (unshown) incorporated in the short cylinder section 42b being connected through a single shaft 42c. The arm section in the loading arm 36 is fixed to the short cylinder section 42b. Moreover, the long cylinder section 42a and the short cylinder section 42b are connected to an unshown compressed air feeder through a pressure air pipeline, which makes it possible to feed compressed air inside these respective sections and to discharge the compressed air from inside the respective sections. Thus-structured loading arm elevation unit 42 makes it possible to perform a vertical movement operation of the long cylinder section 42a and a vertical movement operation of the short cylinder section 42b in combination, by which the short cylinder section 42b itself is vertically moved to achieve the vertical movement operation of the loading arm 36. It is to be noted that the vertical movement operation of the loading arm 36 is guidable by an LM guide 42b provided in the vertical direction as viewed in FIGS. 3 and 9.

More specifically, the vertical movement operation is performed such that the piston of the long cylinder section 42a is positioned at an upper end position of its stroke, and the piston of the short cylinder section 42b is positioned at a lower end position of its stroke, so as to position the loading arm 36 at an uppermost height position H4 of its vertical movement operation.

Further, the piston of the long cylinder section 42a is positioned at the upper end position of its stroke and the piston of the short cylinder section 42b is positioned at the upper end position of its stroke so as to position the loading arm 36 at a second highest height position H3 of its vertical movement operation.

Further, the piston of the long cylinder section 42a is positioned at a lower end position of its stroke and the piston of the short cylinder section 42b is positioned at the lower end position of its stroke so as to position the loading arm 36 at a third highest height position H2 of its vertical movement operation.

Further, the piston of the long cylinder section 42a is positioned at the lower end position of its stroke and the piston of the short cylinder section 42b is positioned at the upper end position of its stroke so as to position the loading arm 36 at a lowermost height position H1 of its vertical movement operation.

It is to be noted that as shown in FIG. 3, height position H3, from among all aforementioned height positions, is a height position which allows the substrate 3 supported by the respective transportation rails 32a to be sucked and held by the loading arm 36, and height position H4 is a height position which allows the substrate 3, that is escaped above the respective transportation rails 32a and sucked and held by the loading arm 36, to be moved without interfering with the respective transportation rails 32a. Height position H1 is a height position which allows the substrate 3 in a state of being held by the substrate holding base 28, or which allows the substrate 3 to be placed on the substrate holding base 28, and height position H2 is a height position which allows the substrate 3 held by the loading arm 36 to avoid vertical interference with another substrate 3 in a state of being disposed on the substrate holding base 28.

Further, in the present embodiment, height position H4 is an example of a first retreat height position, height position H3 is an example of a first height position, height position H2 is an example of a second retreat height position (or an example of a height position enabling the substrate holding base 28 to retreat), and height position H1 is an example of a second height position. Moreover, as shown in FIG. 9, the unloading arm elevation unit 44 is composed of a long cylinder section 44a, a short cylinder section 44b, a shaft 44c and an LM guide 44d.

It is to be noted that in one example of a relationship among height dimensions of respective height positions H1 to H4, assuming that height position H1 as a reference height is 0 mmH, height position H2 would be 20 mmH, height position H3 would be 80 mmH and height position H4 would be 100 mmH.

Moreover, as shown in FIG. 2, FIG. 3 and FIG. 9, the substrate transportation direction movement unit 46 includes a ball screw axis section 46a located along substrate transportation direction B, a nut section 46c engaged with the ball screw axis section 46a, and a drive motor 46b for driving the ball screw axis section 46a so that the ball screw axis section 46a rotates around a center of its axis. Further, the long cylinder section 42a of the loading arm elevation unit 42 and the long cylinder section 44a of the unloading arm elevation unit 44 are fixed to the nut section 46c. By driving the drive motor 46b in either a normal direction or inverse direction, the ball screw axis section 46a is rotated around the center of its axis so as to move engaged nut section 46c back and forth along substrate transportation direction B, which makes it possible to integrally move the loading arm 36 and the unloading arm 38 back and forth along substrate transportation direction B. Further, such back and forth movement is guided by an LM guide 46d provided along substrate transportation direction B.

It is to be noted that the substrate transportation direction movement section 46 can move the loading arm 36 and the unloading arm 38 at a normal movement speed as one specified speed, and also at a slow movement speed as another specified speed which is slower than the aforementioned specified speed, selectively. For example, in a case where the component-mounted substrate 3 with the electronic components 2 already mounted thereon is moved in a state of being sucked and held by the unloading arm 38, mounted electronic components 2 may suffer displacement from mounted positions due to vibration and the like during this movement, and accordingly, in order to prevent such displacement from the mounted positions from occurring, movement at the slow movement speed is performed selectively. In a case where the unloading arm 38 is not in a state of sucking and holding the component-mounted substrate 3, movement at the normal movement speed is performed regardless of whether another substrate 3 is sucked and held by the loading arm 36. Thus, by using two kinds of movement speed as a situation demands, it becomes possible to achieve both quality preservation during movement of the substrate 3 and reduction of a time required for the movement. It is to be noted that the case where the slow movement speed is set slower than the normal movement speed may be replaced with a case where an acceleration in slow movement is set smaller than an acceleration in normal movement.

Description is herein given of "the speed of the slow movement". There are various kinds of methods for mounting electronic components such as bare ICs onto substrates, including a method in which electronic components and substrates are securely bonded by use of ultrasonic waves, heating and pressurization, and a method in which electronic components are temporarily fixed with aid of flux or conductive paste and then in another step, permanent fixing processing such as batch reflow and paste hardening is performed to obtain secure bonding strength. In a bonding method involving temporary fixing of electronic components, when a component-mounted substrate is moved in a state of being sucked and held by the unloading arm 38, displacement of the electronic components may occur due to vibration of the unloading arm 38, and displacement of the electronic components may also occur due to acceleration at a start of the movement, speed reduction at an end of the movement, and stoppage of the movement. Further, a temporarily-fixed bonding face may be separated by vibration, thereby resulting in failure of establishing normal electric connection after the permanent fixing processing.

Consequently, such a slow movement speed is used to prevent this problem from occurring. For example, normal movement is performed with a speed of 400 mm/s and an acceleration time of 0.1 s (an acceleration of 4000 mm/s$^2$), whereas slow movement is performed, in a case where the component mounting apparatus is held, with a speed of 100 mm/s and an acceleration time of 0.1 s (an acceleration of 1000 mm/s$^2$). Under such movement conditions, assuming that a movement distance of the unloading arm 38 is 250 mm, an amount of time required for completing a movement operation would be about 0.7 s in the normal movement and about 2.6 s in the slow movement.

Next, a planar positional relationship among a feed position, a discharge position and the like of the substrate 3, when the substrate 3 is fed and discharged with use of the substrate transportation apparatus 30, will be described with reference to a schematic explanatory view shown in FIG. 4.

Figure 4:
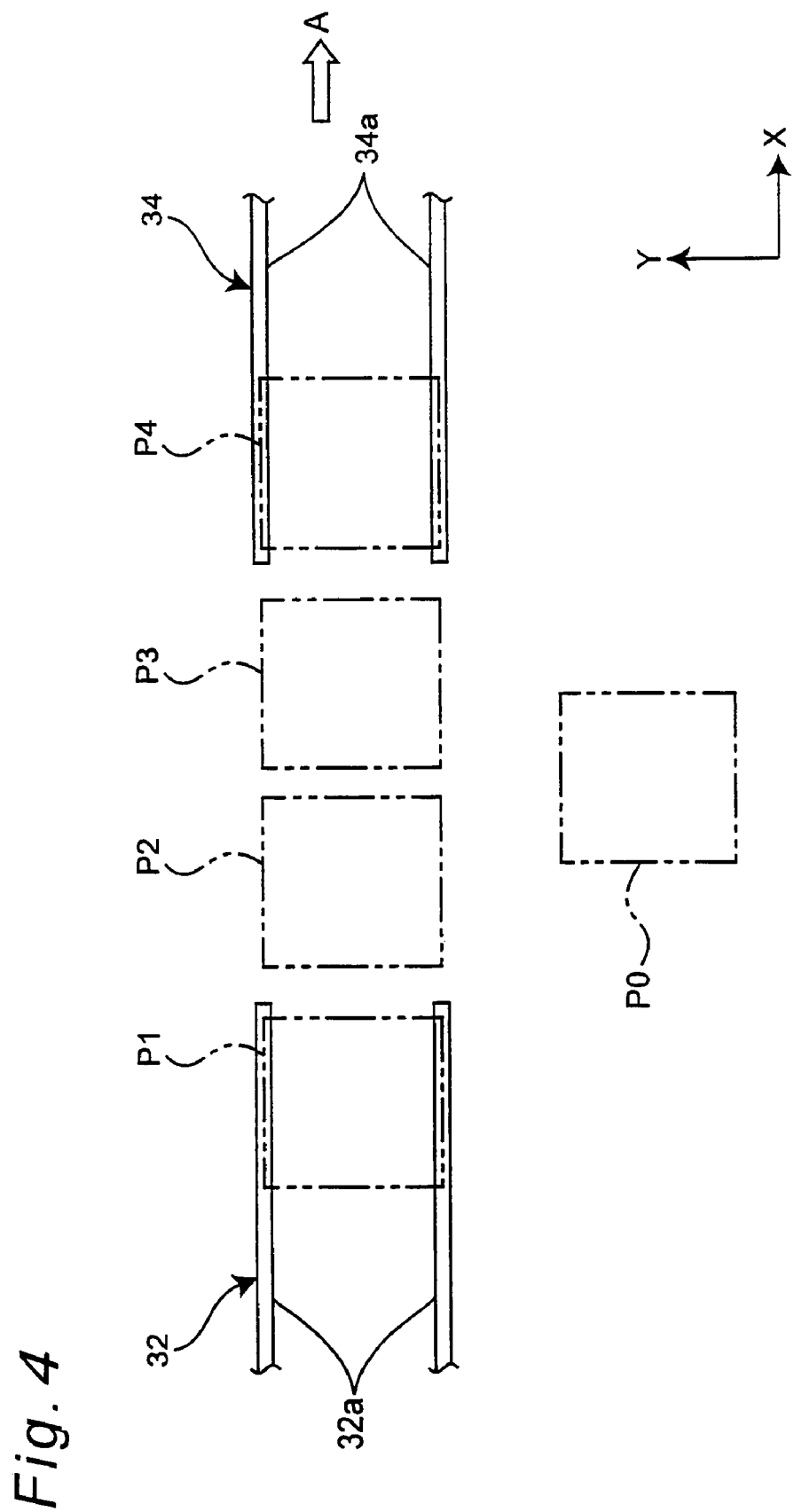
FIG. 4 is a schematic explanatory view showing planar respective substrate positions in the electronic component mounting apparatus of FIG. 1.

As shown in FIG. 4, on base 24 of the electronic component mounting apparatus 101, four substrate positions on which the substrate 3 is locatable are provided adjacent each other along substrate transportation direction B in the vicinity of the loader 32 and the unloader 34 of the substrate transportation apparatus 30.

First, a first substrate position P1, from among the four substrate positions, which is positioned at the far left as viewed in FIG. 4, is a position at which the substrate 3 transported by the loader 32 is temporarily on standby in a feedable state while both its end portions are supported by the respective transportation rails 32a. The substrate 3 in a state of being positioned at the first substrate position P1 is removable through suction and holding by the loading arm 36. A fourth substrate position P4 which is positioned at the far right as viewed in FIG. 4 is a position on which substrate 3, that is transported and discharged by the unloader 34, is positioned, i.e., a position on which the substrate 3 is positioned while both its end portions are supported by the respective transportation rails 34a. The substrate 3 is transferred in the state of being sucked and held by the unloading arm 38, by which the substrate 3 can be positioned at the fourth substrate position P4.

Moreover, as shown in FIG. 4, between end portions of the respective transportation rails 32a of the loader 32 and end portions of the respective transportation rails 34a of the unloader 34, a second substrate position P2 and a third substrate position P3 are located. A disposition relationship between the second substrate position P2 and the third substrate position P3 is identical to a disposition relation between the loading arm 36 and the unloading arm 38, so that when the substrate 3 sucked and held by the loading arm 36 is positioned above the second substrate position P2, another substrate 3 sucked and held by the unloading arm 38 is positioned above the third substrate position P3. Moreover, by performing a movement operation of the substrate holding base 28 by the XY table 26, the substrate holding base 28 can be positioned selectively at each of the second substrate position P2 and the third substrate position P3, which allows the substrate holding base 28 to hold the substrate 3 or release a holding state at respective positions. Further, below the second substrate position P2 and the third substrate position P3 as viewed in FIG. 4, a substrate mounting region P0 is located, so that, for example, the substrate 3 fed to and held on the substrate holding base 28 at the second substrate position P2 may be moved to the XY table 26 and located on the substrate mounting region P0 while being held on the substrate holding base 28. Further, the substrate 3 held by the substrate holding base 28 may be moved by the XY table 26 from the substrate mounting region P0 so as to be positioned at the third substrate position P3.

Figure 14:
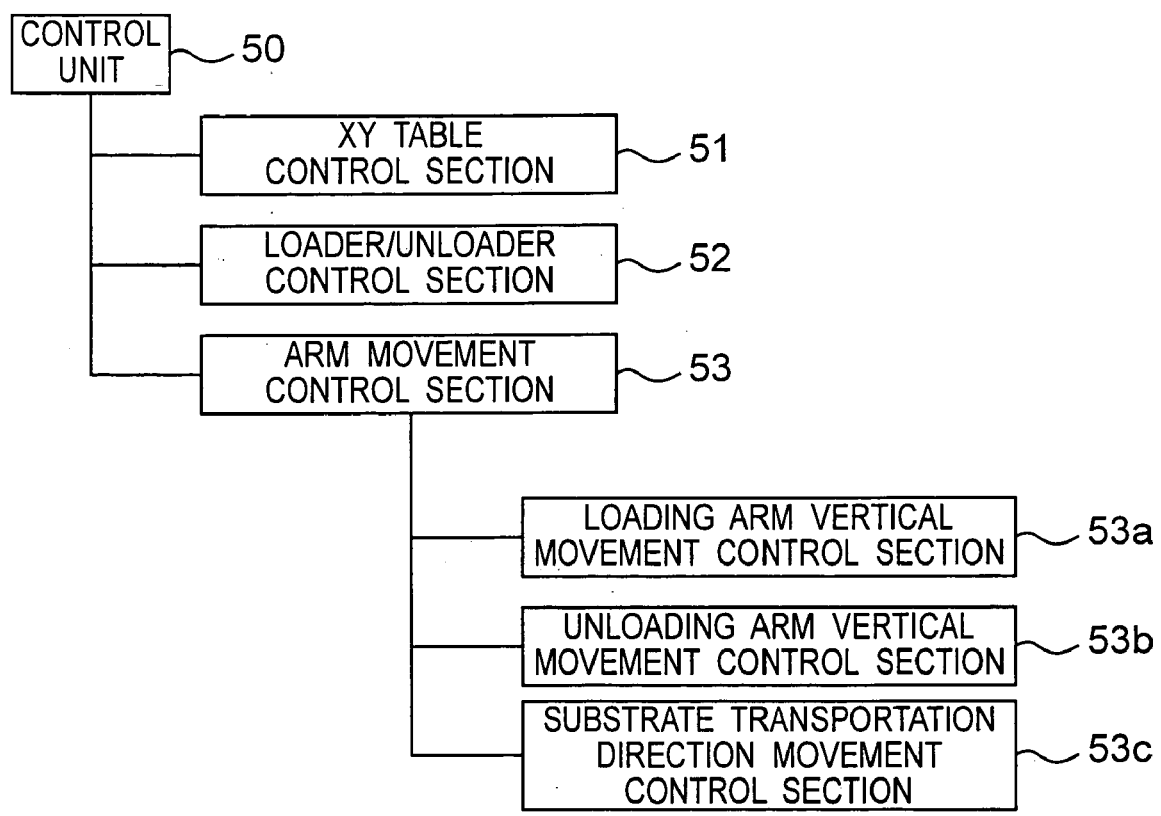
FIG. 14 is a control block diagram showing a main structure of a control section in the substrate transportation apparatus of FIG. 2.

Next, a block diagram showing a main structure of a control unit 50 included in thus-structured substrate transportation apparatus 30 is shown in FIG. 14. As shown in FIG. 14, the control unit 50 includes an XY table control section 51 for controlling a movement operation of the XY table 26, a loader/unloader control section 52 for controlling a transportation operation of the substrate 3 by the loader 32 and the unloader 34, and an arm movement control section 53 for controlling an operation of the arm movement unit 40. It is to be noted that instead of the above-stated case, the XY table control section 51 may be included in a mounting control unit (unshown) in the electronic component mounting apparatus 101, or may be included in both the mounting control unit and the control unit 50 so as to perform control that is associated with each other.

Further, the arm movement control section 53 includes a loading arm vertical movement control section 53a for controlling the vertical movement operation of the loading arm 36, and an unloading arm vertical movement control section 53b for controlling the vertical movement of the unloading arm 38. In these sections, feed and discharge of compressed air to/from the long cylinder sections 42a, 44a and the short cylinder sections 42b, 44b are controlled. Further, the arm movement control section 53 includes a substrate transportation direction movement control section 53c for controlling the movement operation of the substrate transportation direction movement section 46.

Thus-structured control section 50 allows respective operations to be associated with each other so as to achieve a comprehensive control operation.

Description is now given of operation of thus-structured substrate transportation apparatus 30 to feed (or load) the substrate 3 and to discharge (or unload) the substrate 3 with the electronic components 2 mounted thereon. It is to be noted that control of the following respective operations in the substrate transportation apparatus 30 is comprehensively performed while being associated with each other by the control unit 50.

FIG. 5A, FIG. 5B, FIG. 5C, FIG. 5D and FIG. 5E are schematic explanatory views which respectively explain a feed and discharge operation of the substrate 3 to/from the substrate holding base 28 of the electronic component mounting apparatus 101 with use of schematic views. In FIG. 5A to FIG. 5D, a newly fed substrate 3 is referred to as a substrate 3A, and a component-mounted substrate 3 on which the electronic components 2 have been mounted is referred to as a substrate 3B. Further, a relational timing chart of the respective operations corresponding to operations in the schematic explanatory views of FIGS. 5A-5E is shown in FIG. 6. It is to be noted that in FIG. 6, a vertical axis represents respective operation items and a horizontal axis represents time. The respective operation items include execution/stoppage of the mounting operation for mounting the electronic components 2 onto the substrate 3 in the electronic component mounting apparatus 101, execution/stoppage of the movement operation of the substrate holding base 28 by the XY table 26, respective vertical movement height positions of the loading arm 36 and the unloading arm 38, execution/stoppage of the sucking and holding operation of the substrate 3 by the loading arm 36 and the unloading arm 38, and execution/stoppage of an integral movement operation of the loading arm 36 and the unloading arm 38 by the substrate transportation direction movement section 46. As for time, time points T1 to T14 are presented as significant time points of the respective operations. The operations and states at respective time points will be described hereinbelow.

Figure 5:
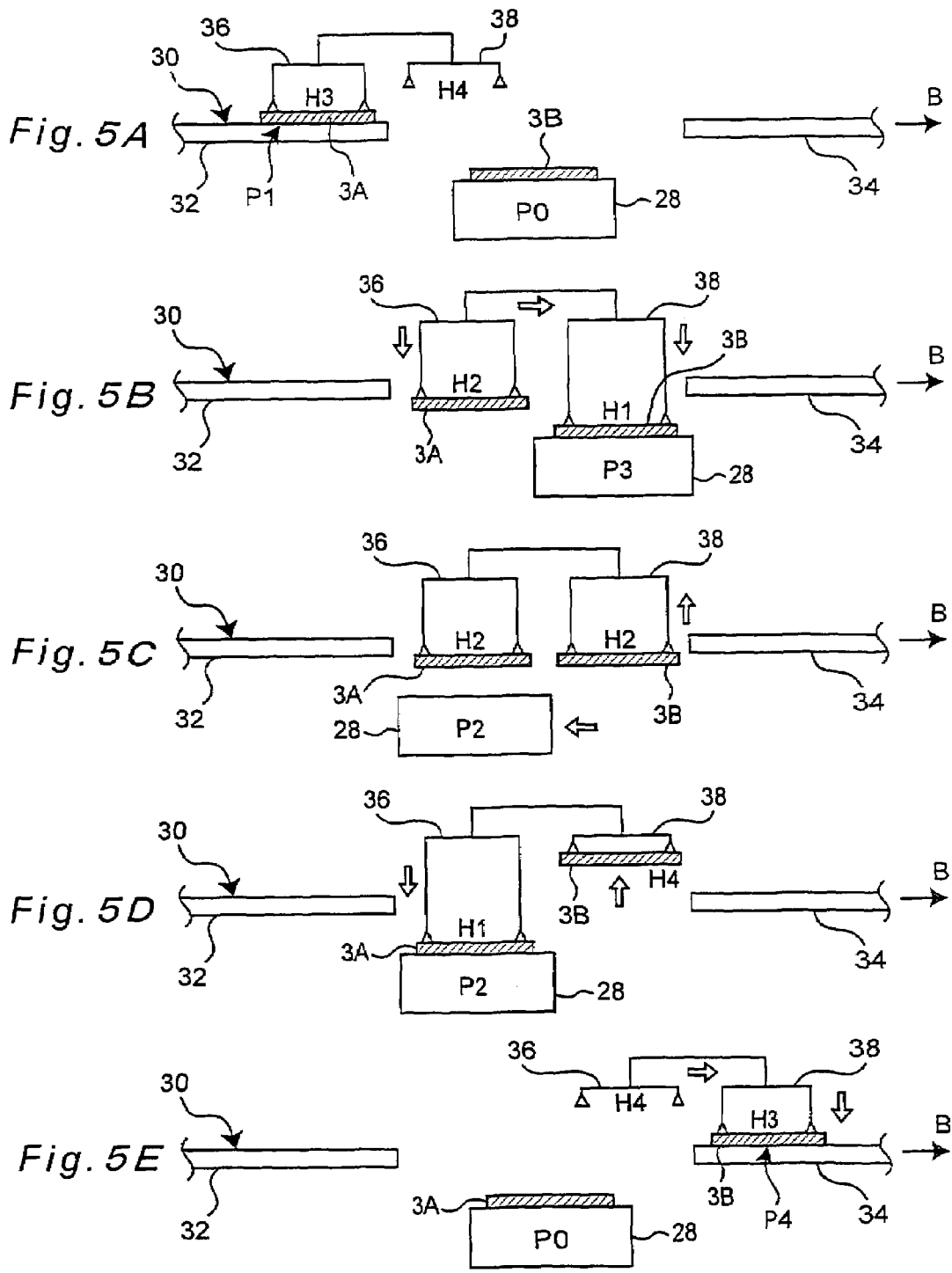
FIG. 5A, FIG. 5B, FIG. 5C, FIG. 5D and FIG. 5E are, respectively, schematic explanatory views showing respective operations for feeding and discharging substrates in the electronic component mounting apparatus of FIG. 1, with FIG. 5A showing a state in which components are mounted onto a substrate held on a substrate holding base and a next new substrate is positioned at a first substrate position, FIG. 5B showing a state in which this component-mounted substrate is moved to a third substrate position in a state of being held on the substrate holding base and the new substrate is moved to the second substrate position, FIG. 5C showing a state in which the substrate holding base that released a state of holding the component-mounted substrate is moved to the second substrate position, FIG. 5D showing a state in which the new substrate is placed on the substrate holding base, and FIG. 5E showing a state in which the component-mounted substrate is moved to a fourth substrate position and a component mounting operation for mounting components on the new substrate placed on the substrate holding base is started.
Figure 6:
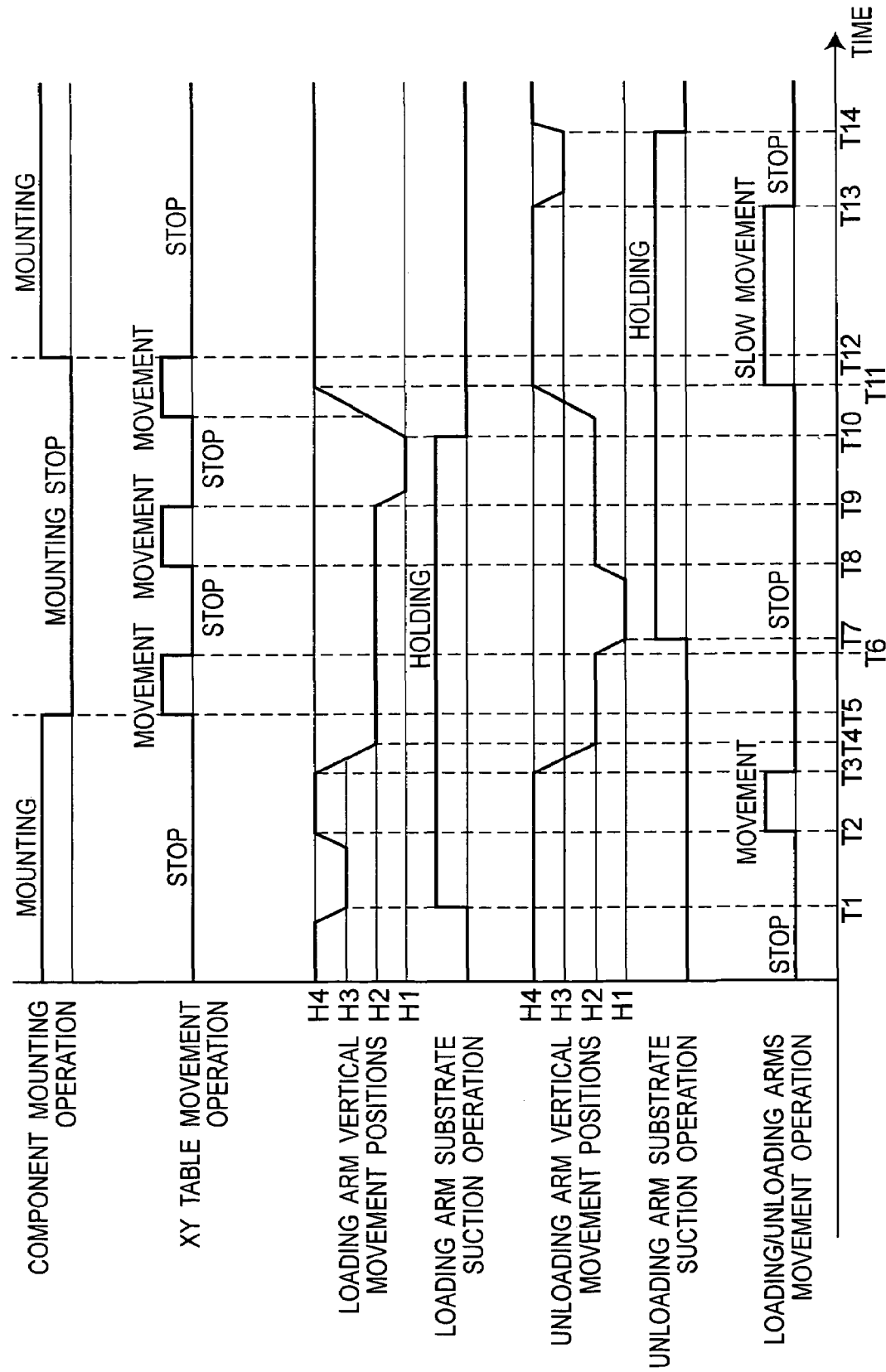
FIG. 6 is a timing chart showing respective operations for feeding and discharging the substrates in FIG. 5, with a vertical axis representing operational contents and a horizontal axis showing time.

As shown in FIG. 5A, in the electronic component mounting apparatus 101, a mounting operation of respective electronic components 2 is performed on substrate 3B which is in a state of being held by the substrate holding base 28 and positioned at the substrate mounting region P0. In the substrate transportation apparatus 30, a new substrate 3A which is not yet subjected to a mounting operation of electronic components 2 is transported by the loader 32 in substrate transportation direction B, and the substrate 3A is fed so as to be positioned at the first substrate position P1. Then, the loading arm 36 and the unloading arm 38 in a state of being positioned at height position H4 are moved by the substrate transportation direction movement section 46 so that the loading arm 36 is positioned at the first substrate position P1. Then, the loading arm 36 is moved downward from height position H4 to height position H3 so as to suck and hold the substrate 3A positioned at the first substrate position P1 (time point T1).

After that, the loading arm 36 is moved upward to height position H4 and the substrate 3A is removed from the first substrate position P1. At the same time, the loading arm 36 is moved to height position H4 above the second substrate position P2 and the unloading arm 38 is moved to height position H4 above the third substrate position P3 integrally by the substrate transportation direction movement section 46 (time period T2 to T3). Then, the substrate 3A in a state of being sucked and held by the loading arm 36 is moved downward and positioned at height position H2, and the unloading arm 38 is also put in a state of being moved downward to height position H2 (time point H4).

Meanwhile, in the substrate mounting region P0, mounting of respective electronic components 2 on the substrate 3B is completed (time period T5), and the substrate 3B in a state of being held by the substrate holding base 28 is moved by the XY table 26 to the third substrate position P3 (time period T6).

Then, as shown in FIG. 5B, the unloading arm 38 is moved downward from height position H2 to height position H1, and the substrate 3B held by the substrate holding base 28 is sucked and held. At the same time, a holding state of the substrate 3B by the substrate holding base 28 is released, the unloading arm 38 is moved upward to height position H2, whereby the substrate 3B is removed from a top of the substrate holding base 28 (time period T7 to T8).

Next, as shown in FIG. 5C, the substrate holding base 28 from which the substrate 3B has been removed is moved to the second substrate position P2 by the XY table 26 (time period T8 to T9).

Then, as shown in FIG. 5D, the substrate 3A in a state of being sucked and held by the loading arm 36 is moved downward from height position H2 to height position H1, and the substrate 3A is placed on the upper surface of the substrate holding base 28 positioned at the second substrate position P2. At the same time, the substrate 3A is held by the substrate holding base 28, and the substrate 3A is released from the sucked and held state by the loading arm 36 (time period T9 to T10). After that, the loading arm 36 is moved upward from height position H1 to height position H4, and the substrate 3B sucked and held by the unloading arm 38 is moved upward from height position H2 to height position H4 (time period T10 to T11).

Meanwhile, as shown in FIG. 5E, the substrate holding base 28 to which a new substrate 3A has been fed is moved to the substrate mounting region P0 by the XY table 26 (time period T10 to T11). After the substrate holding base 28 is moved to the substrate mounting region P0, a mounting operation for mounting the electronic component 2 onto the substrate 3A is started (time period T12 and after). Moreover, in parallel with a start of the mounting operation, and without inflicting an influence on such mounting operation of the substrate 3A, the substrate 3B in a state of being sucked and held by the unloading arm 38 is moved above the fourth substrate position P4 by the substrate transportation direction movement unit 46 (time period T11 to T13). It is to be noted that during such movement, electronic components 2 are mounted onto the substrate 3B which is sucked and held by the unloading arm 38, and therefore the movement is performed at the slow movement speed so as not to cause displacement from mounted positions. Then, the substrate 3B sucked and held by the unloading arm 38 is moved downward from height position H4 to height position H3, and is placed on the fourth substrate position P4 in the unloader 34. At the same time, the substrate 3B is released from the sucked and held state by the unloading arm 38, the unloading arm 38 is moved upward, and the substrate 3B is delivered to the unloader 34 (time period T13 to T14). Then, the substrate 3B positioned at the fourth substrate position P4 is transported in substrate transportation direction B and the substrate 3B is discharged.

It is to be noted that repeated and sequential execution of the above-stated feed operation of the substrate 3A, and the discharge operation of the substrate 3B, makes it possible to sequentially feed substrates 3 to the electronic component mounting apparatus 101 and to sequentially discharge substrates 3 on which a mounting operation has been performed in the electronic component mounting apparatus 101.

Further, there is shown a specific example of respective time periods in the time chart, in which, assuming that a movement operation is performed with a movement distance in the time period T2 to T3, the time period T8 to T9, and the time period T11 to T13 being 250 mm, a movement speed in the time period T2 to T3 and the time period T8 to T9 being 400 mm/s, and an acceleration time in these time periods being 0.1 s (an acceleration being 4000 mm/s$^2$), the time period T2 to T3 and the time period T8 to T9 are respectively about 0.7 s, and the time period T11 to T13 is about 2.6 s. Also, a time for completing operations in the time period T5 to T12 is about 5 s.

(Modified Example of Present Embodiment)

Description is now given of an embodiment according to a modified example of the method for feeding and discharging substrate 3 in the electronic component mounting apparatus 101 in the present embodiment.

As shown in the timing chart in FIG. 6, in the above-described present embodiment, during a duration of time from time point T4, at which a substrate 3A newly fed by the loader 32 is sucked and held by the loading arm 36 and the substrate 3A is positioned at height position H2 above the second substrate position P2 while the unloading arm 38 is positioned at height position H2 above the third substrate position P3, to time point T6, at which the substrate 3B with the electronic components 2 mounted thereon is moved by the XY table 26 and is positioned at the third substrate position P3, the substrate transportation apparatus 30 is on standby without performing any operation.

In such a substrate transportation apparatus 30, at the first substrate position P1 in the loader 32, the substrate 3 positioned thereat is subjected to a preheating treatment as a treatment for smoothing a mounting operation of the electronic components 2 that is performed thereafter. Such a preheating treatment is achieved by disposing, as shown in FIG. 2, a preheating section 90 at the first substrate position P1 in the loader 32. It is to be noted that a preheating temperature for the substrate 3 is, for example, around 100° C.

However, during a duration of time from the time period T4 to T6, i.e., during a standby time, the substrate 3 is already removed from the first substrate position P1, and therefore it is impossible to apply a preheating treatment thereto. Consequently, though the standby time will not inflict a direct influence on a stoppage time of the mounting operation of the electronic components 2, a longer standby time causes a temperature of the substrate 3, which has been subject to a preheating treatment and is in the state of being preheated, to drop. In such a case, when the substrate 3 is reheated during the mounting operation of the electronic components 2, a time necessary for this reheating operation is prolonged, which may prevent a smooth mounting operation.

In order to solve such a problem, in the present modified example, standby time T4 to T6 is designed to be shortened.

More specifically, first, a time during which the substrate 3A positioned at the first substrate position P1 in the loader 32 in FIG. 6 is sucked and held by the loading arm 36, and the substrate 3A is positioned at height position H2 above the second substrate position P2, i.e., the time period T1 to T4, is measured to be used as a substrate feed preparation time period Ts.

Meanwhile, in the electronic component mounting apparatus 101, a time period necessary for the mounting operation of the electronic components 2 performed on respective substrates 3 is measured in sequence, and a smallest time period is updated as a component mounting time period Tb. It is to be noted that respective operations including setting (or storing) of the substrate feed preparation time period Ts and updating of the component mounting time period Tb are performed, for example, in a mounting control unit (unshown) included in the electronic component mounting apparatus 101. Moreover, later-described control on respective operations based on this substrate feed preparation time period Ts and component mounting time period Tb is executed in the mounting control unit. The mounting control unit and the control unit 50 in the substrate transportation apparatus 30 are connected to each other so that control operations can be executed comprehensively while being associated with each other.

Comparing the component mounting time period Tb and the substrate feed preparation time period Ts makes it possible to calculate an optimum duration of time during which a newly fed substrate 3 is on standby at the first substrate position P1, a preheating treatment is applied to the substrate 3, and the substrate 3 is removed in a state of being sucked and held by the loading arm 36. For example, a duration of time during which the substrate 3 is on standby at the first substrate position P1 and is subjected to the preheating treatment may be calculated based on an equation: (component mounting time period Tb)−(substrate feed preparation time period Ts).

Thus, the component mounting time period Tb and the substrate feed preparation time period Ts are measured, and based on a measurement result, an optimum duration of time during which the substrate 3 is on standby at the first substrate position P1 and is subjected to the preheating treatment is calculated, so that a standby time during the time period T4 to T6 in FIG. 6 may be shortened (if optimization is applied, it is possible to make the standby time 0), which prevents a temperature of preheated substrate 3 from dropping, and allows a smooth mounting operation of the electronic components 2 in the electronic component mounting apparatus 101. Moreover, vertical movements of the loading arm 36 and the unloading arm 38 are performed by respective cylinders of the loading arm elevation unit 42 and the unloading arm elevation unit 44, which makes it possible to solve a problem of difficulties in controlling movement time. It is to be noted that in one example, assuming that the component mounting time period Tb is 2.5 s and the substrate feed preparation time period Ts is 2.0 s, the standby time would be 0.5 s.

(Another Modified Example of Present Embodiment)

Description is now given of an embodiment according to another modified example of a method for feeding and discharging substrate 3 in the electronic component mounting apparatus 101 in the present embodiment.

In the above-described present embodiment, the electronic component mounting apparatus 101 is used when a width of a widely-used substrate 3, that is a linear dimension along substrate transportation direction B, is around 250 mm. Therefore, dimensions between the loader 32 and the unloader 34 are determined so that the aforementioned feed and discharge method can be applied to such a substrate 3 with a width of about 250 mm. Further, disposition of respective holding nozzles 36a of the loading arm 36 and disposition of respective holding nozzles 38a of the unloading arm 38 are determined so as to surely hold the substrate 3 with such a size.

In this modified example, description will be given of a feed and discharge method of substrates in which even if a width size of the substrate 3 is larger than 250 mm, an operation for feeding and discharging the substrate 3 is executable.

Figure 7:
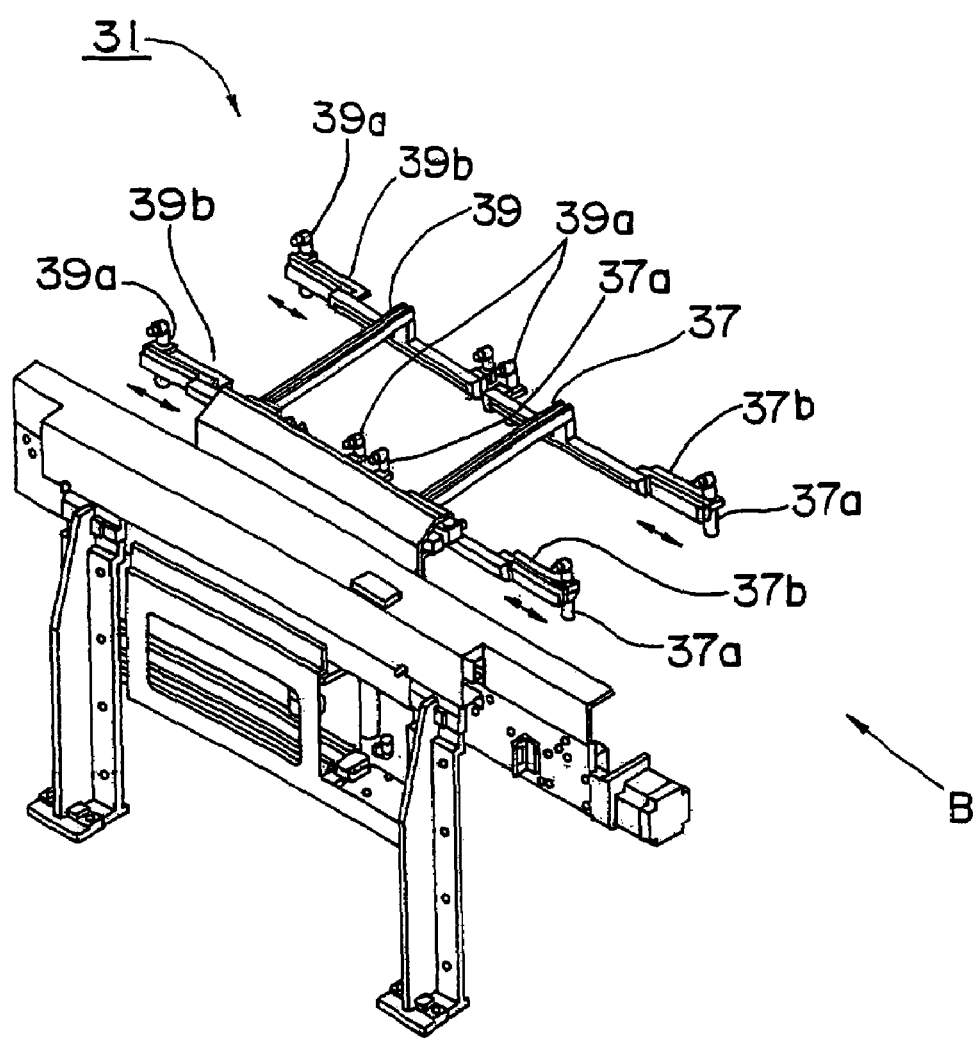
FIG. 7 is a fragmentary enlarged perspective view showing a substrate transportation apparatus according to a modified example of the one embodiment.

First, a perspective view showing a structure of a loading arm and an unloading arm supporting such operation is shown in FIG. 7.

As shown in FIG. 7, a substrate transportation apparatus 31 is equipped with a loading arm 37 and an unloading arm 39, and its basic structure is identical to that of the substrate transportation apparatus 30 except that disposition of holding nozzles 37a and 39a in the loading arm 37 and the unloading arm 39 is variable. Hereinbelow, description will be given of only difference in structure.

As shown in FIG. 7, movable arm sections 37b are attached to respective portions in arm sections in the loading arm 37 on opposite sides of substrate transportation direction B, and holding nozzles 37a are attached to top ends of respective movable arm sections 37b. Moreover, these respective movable arms can move along substrate transportation direction B, and their positions can be fixed at desired movable positions. The unloading arm 39 also shares the same structure as the loading arm 37, and movable arm sections 39b are attached to respective portions of its arm sections on opposite sides of substrate transportation direction B, with holding nozzles 39a being attached to top ends of respective movable arm sections 39b. Consequently, in a case where a width size of the substrate 3 is, for example, larger than 250 mm, the respective movable arm sections 37b and 39b are moved so as to support the width size of the substrate 3, and their movable positions are fixed so as to suck and hold the substrate 3. It is to be noted that a width size of the substrate 3 which can be held by the loading arm 37 and the unloading arm 39 in consideration of movement of the movable arm sections 37b and 39b is, for example, in the range of 250 mm to 330 mm.

Description is now given of feed and discharge operations of substrate 3 in such a substrate transportation apparatus 31 with reference to schematic explanatory views shown in FIG. 8A, FIG. 8B, FIG. 8C, FIG. 8D and FIG. 8E. It is to be noted that in performing the following feed and discharge operations of the substrate 3, movable positions of the movable arm sections 37b and 39b are adjusted in advance in the loading arm 37 and the unloading arm 39 so as to satisfy a width size of the substrate 3. In FIG. 8A to FIG. 8E, a newly fed substrate 3 is referred to as a substrate 3C, and a component-mounted substrate 3 on which electronic components 2 have been mounted is referred to as a substrate 3D.

Figure 8:
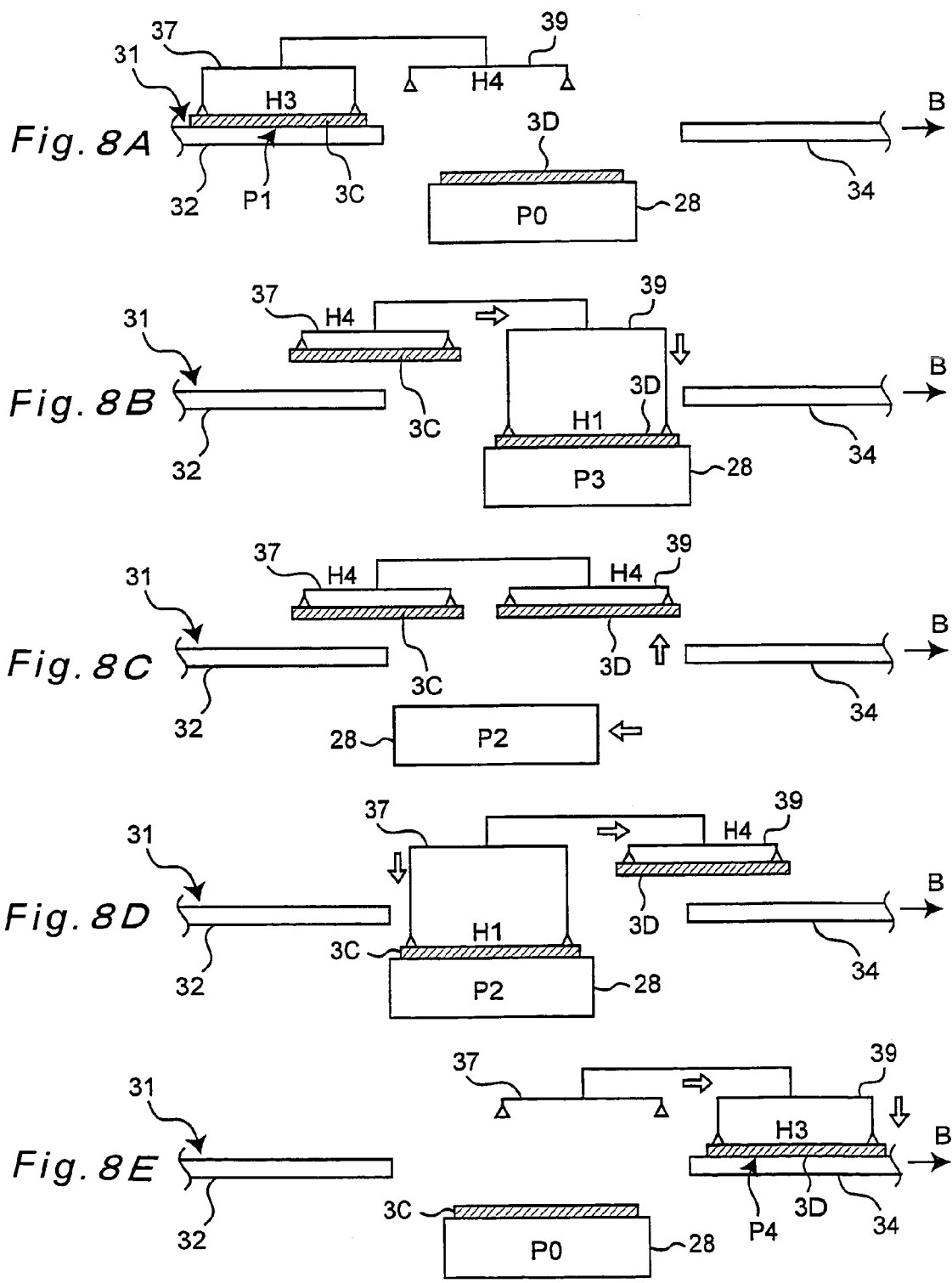
FIG. 8A, FIG. 8B, FIG. 8C, FIG. 8D and FIG. 8E are, respectively, schematic explanatory views showing respective operations for feeding and discharging substrates in an electronic component mounting apparatus including the substrate transportation apparatus of FIG. 7, with FIG. 8A showing a state in which components are mounted on a substrate held on a substrate holding base and a next new substrate is positioned at a first substrate position, FIG. 8B showing a state in which this component-mounted substrate is moved to a third substrate position in a state of being held on the substrate holding base, FIG. 8C showing a state in which the substrate holding base that released a state of holing the component-mounted substrate is moved to a second substrate position, FIG. 8D showing a state in which the new substrate is placed on the substrate holding base, and FIG. 8E showing a state in which the component-mounted substrate is moved to a fourth substrate position and a component mounting operation for mounting components onto the new substrate placed on the substrate holding base is started.

As shown in FIG. 8A, in the electronic component mounting apparatus 101, a mounting operation of respective electronic components 2 is performed on substrate 3D which is in a state of being held by the substrate holding base 28 and positioned at the substrate mounting region P0. In the substrate transportation apparatus 31, new substrate 3C which is not yet subjected to a mounting operation of the electronic components 2 is transported by the loader 32 in substrate transportation direction B, and the substrate 3C is fed so as to be positioned at the first substrate position P1. Then, the loading arm 37 and the unloading arm 39 in a state of being positioned at height position H4 are moved so that the loading arm 37 is positioned at the first substrate position P1. Then, the loading arm 37 is moved downward from height position H4 to height position H3 so as to suck and hold the substrate 3C positioned at the first substrate position P0.

After that, the loading arm 37 is moved upward to height position H4 and the substrate 3C is removed from the first substrate position P1. At the same time, the loading arm 37 is moved to height position H4 and the unloading arm 39 is moved to height position H4 above the third substrate position P3.

Meanwhile, in the substrate mounting region P0, mounting of respective electronic components 2 onto the substrate 3D is completed, and the substrate 3D in a state of being held by the substrate holding base 28 is moved by the XY table 26 to the third substrate position P3.

Then, as shown in FIG. 8B, the unloading arm 39 is moved downward from height position H4 to height position H1, and the substrate 3D held by the substrate holding base 28 is sucked and held. At the same time, a holding state of the substrate 3D by the substrate holding base 28 is released, the unloading arm 39 is moved upward to height position H4, and the substrate 3D is removed from the top of the substrate holding base 28.

Next, as shown in FIG. 8C, the substrate holding base 28 from which the substrate 3D has been removed is moved to the second substrate position P2 by the XY table 26. At the same time, the loading arm 37 is moved so that the substrate 3C sucked and held by the loading arm 37 is positioned at height position H4 above the second substrate position Then, as shown in FIG. 8D, the substrate 3C in a state of being sucked and held by the loading arm 37 is moved downward from height position H4 to height position H1, and the substrate 3C is placed on the upper surface of the substrate holding base 28 positioned at the second substrate position P2. At the same time, the substrate 3C is held by the substrate holding base 28, and the substrate 3C is released from the sucked and held state by the loading arm 37. After that, the loading arm 37 is moved upward from height position H1 to height position H4.

Meanwhile, as shown in FIG. 8E, the substrate holding base 28 to which the new substrate 3C has been fed is moved to the substrate mounting region P0 by the XY table 26. After the substrate holding base 28 is moved to the substrate mounting region P0, a mounting operation for mounting the electronic component 2 onto the substrate 3C is started. Moreover, in parallel with such start of the mounting operation, and without inflicting an influence on such mounting operation on the substrate 3C, the substrate 3D in a state of being sucked and held by the unloading arm 39 is moved above the fourth substrate position P4. It is to be noted that during this movement, the electronic components 2 are mounted on the substrate 3D which is sucked and held by the unloading arm 39, and therefore this movement is performed at the aforementioned another specified slow speed so as not to cause displacement from mounted positions. Then, the substrate 3D sucked and held by the unloading arm 39 is moved downward from height position H4 to height position H3, and is placed on the fourth substrate position P4 in the unloader 34. At the same time, the substrate 3D is released from the sucked and held state by the unloading arm 39, the unloading arm 39 is moved upward, and the substrate 3D is delivered to the unloader 34. Then, the substrate 3D positioned at the fourth substrate position P4 is transported in substrate transportation direction B and the substrate 3D is discharged.

It is to be noted that repeated and sequential execution of the above-stated feed operation of the substrate 3C and the discharge operation of the substrate 3D makes it possible to sequentially feed substrates 3 to the electronic component mounting apparatus 101 and to sequentially discharge substrates 3 on which a mounting operation has been performed in the electronic component mounting apparatus 101.

In each of the aforementioned embodiments, description has been given of a case where a substrate-transportation direction is substrate transportation direction B, which is a direction facing leftward in the X-axis direction in FIG. 1. However, without being limited to such a case, the substrate-transportation direction may be a direction facing rightward in the X-axis direction in FIG. 1. It should naturally be understood that in such electronic component mounting apparatus 101, in accordance with the substrate-transportation direction, a disposition of the loading arm 36 and the unloading arm 38 as well as a disposition of the loader 32 and the unloader 34 would be switched.

(Effects by Embodiments)

According to the above embodiments, the following various effects can be achieved.

First, in the electronic component mounting apparatus 101, when the substrate 3 with the respective electronic components 2 being mounted thereon is discharged, the mounting operation for mounting the electronic components 2 on a newly fed substrate 3 can be performed in parallel with and independently of a movement operation for moving the substrate 3 to the unloader 34 by the unloading arm 38 whose transportation speed is limited to be slow in order to prevent displacement of mounted respective electronic components 2 from mounted positions. Therefore, in the electronic component mounting apparatus 101, it becomes possible to reduce an influence of an operation for feeding and discharging the substrate 3 on stoppage time of the mounting operation for mounting the electronic components 2 on fed substrate 3, which allows reduction in stoppage time of the mounting operation and increase in productivity in the mounting operation of the electronic components 2.

More specifically, based on the timing chart shown in FIG. 6, in the time period from T10 onward after completion of the feeding operation of the substrate 3A to the substrate holding base 28 by the loading arm 36, a movement operation for moving the substrate 3A, in a state of being held by the substrate holding base 28, to the substrate mounting region P0 and an operation onward can be performed independently of and in parallel with a movement operation for moving the component-mounted substrate 3B, sucked and held by the unloading arm 38, to the unloader 34 and an operation onward. As a result, for example, at the time point T12 during the movement operation of the substrate 3B by the unloading arm 38, it becomes possible to position the substrate 3A at the substrate mounting region P0 and to start the mounting operation for mounting the electronic components 2 onto the substrate 3A. Therefore, such a problem as seen in the conventional component mounting apparatus 231 in which the movement operation for discharging the substrate 233B directly affects a stoppage time of the component mounting operation, thereby causing the stoppage time to be prolonged with increase in productivity in the component mounting operation being hindered, may be prevented in the electronic component mounting apparatus 101 in the present embodiment, which makes it possible to increase productivity in the component mounting operation.

Particularly during the movement operation of the component-mounted substrate 3B to the unloader 34, the movement speed of the unloading arm 38 being limited to the slow movement speed in order to prevent the respective mounted electronic components 2 from being displaced from mounted positions, and therefore as described above, allowing respective operations to be performed independently of and in parallel with each other, is effective for increasing productivity.

Further, the above effects may be achieved by providing the electronic component mounting apparatus 101 with the XY table 26 which is capable of moving the substrate holding base 28, that can hold the substrate 3, to the substrate mounting region P0, the second substrate position P2 and the third substrate position P3, and by minimizing a movement operation of the unloading arm 38 which is in a state of sucking and holding the component-mounted substrate 3B until the new substrate 3A is fed to the substrate holding base 28.

Further, in the substrate transportation apparatus 30, the loading arm elevation unit 42 for separately moving the loading arm 36 and the unloading arm 38 in a vertical direction includes the long cylinder section 42a and the short cylinder section 42b as two cylinders whose strokes are different from each other, so that respective vertical movement height positions of the loading arm 36 and the unloading arm 38 can be controlled to four level height positions. Thus, the vertical movement height position is controllable to four level height positions, and therefore, compared to, for example, a case where vertical movement is controllable only to two level height positions, it becomes possible, through execution of the vertical movement in a phased manner, to prolong a time period during which a vertical movement operation can be performed in parallel with other operations, thereby making it possible to reduce a time necessary for a practical vertical movement operation. This allows substantial reduction of a time necessary for feed and discharge operations of the substrate 3, allows reduction of a stoppage time of the component mounting operation in order to feed and discharge the substrate 3, and further allows increase in productivity in the component mounting operation.

It is to be noted that, by properly combining arbitrary embodiments of the aforementioned various embodiments, effects possessed thereby can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The invention claimed is:

1. A method of transporting substrates as part of a component mounting operation which is for positioning the substrates, when placed and held on a substrate holding base, at a substrate mounting region and mounting components onto the substrates so as to offer the substrates as component-mounted substrates, said method comprising:

using a substrate feed holder to hold a substrate at a first substrate position, with said substrate having been transported to said first substrate position along a transportation direction, and with said first substrate position, a second substrate position, a third substrate position, and a fourth substrate position being arranged sequentially next to each other;

positioning said substrate, while held by said substrate feed holder, at a height position above said second substrate position, and positioning a substrate discharge holder at a height position above said third substrate position, by moving said substrate feed holder and said substrate discharge holder separately in a vertical direction and moving said substrate feed holder and said substrate discharge holder in an integrated state along said substrate-transportation direction;

moving said substrate holding base, which is holding a component-mounted substrate in said substrate mounting region, to said third substrate position;

discharging said component-mounted substrate from said substrate holding base by moving said substrate discharge holder downward, using said substrate discharge holder to hold said component-mounted substrate, and then moving said substrate discharge holder, along with said component-mounted substrate, upward to a higher height position; then moving said substrate holding base to said second substrate position;

feeding said substrate to said substrate holding base by moving said substrate feed holder downward and releasing said substrate from said substrate feed holder; and moving said substrate holding base to which said substrate has been fed to said substrate mounting region, while moving said component-mounted substrate held by said substrate discharge holder to said fourth substrate position in an integrated state with said substrate feed holder along said substrate-transportation direction.

2. The method according to claim 1, wherein
moving said component-mounted substrate held by said substrate discharge holder to said fourth substrate position comprises moving said component-mounted substrate after beginning performance of a mounting operation, in said substrate mounting region, for mounting components onto said substrate fed to said substrate holding base.

3. The method according to claim 1, wherein
moving said component-mounted substrate held by said substrate discharge holder to said fourth substrate position comprises moving said substrate discharge holder such that a speed or an acceleration of said substrate discharge holder is less than a speed or an acceleration, respectively, of said substrate discharge holder when said substrate discharge holder is not holding said component-mounted substrate.

4. The method according to claim 1, further comprising:
performing timing control such positioning said substrate, while held by said substrate feed holder, at said height position above said second substrate position, positioning said substrate discharge holder at said height position above said third substrate position, and moving said substrate holding base to said third substrate position, results in said substrate feed holder and said substrate discharge holder being positioned, almost as soon as said substrate holding base is moved to and positioned at said third substrate position, at a height position so as to avoid said substrate holding base at said third substrate position.

5. The method according to claim 1, further comprising: performing timing control such that using said substrate feed holder to hold said substrate transported to said first substrate position comprises using said substrate feed holder to hold said substrate based on
  (i) an amount of time necessary for mounting the components onto said substrate positioned in said substrate mounting region and offering this substrate as a component-mounted substrate, and
  (ii) an amount of time necessary for holding by said substrate feed holder said substrate transported to said first substrate position, and positioning this held substrate at the height position above said second substrate position.

6. A substrate transportation apparatus for transporting substrates by feeding the substrates to a mounting unit which is to mount components onto the substrates and offer the substrates as component-mounted substrates, and by discharging the component-mounted substrates from the mounting unit, comprising:
  a loader unit for loading a substrate along a substrate-transportation direction such that the substrate becomes positioned at a first substrate position, from among the first substrate position, a second substrate position, a third substrate position and a fourth substrate position, with the first, second, third and fourth substrate positions being arranged sequentially next to one another;
  an unloader unit for unloading from the fourth substrate position a substrate positioned thereat;
  a substrate feed holder for releasably holding the substrate positioned at the first substrate position and then transferring this substrate to the second substrate position;
  a substrate discharge holder for releasably holding a substrate positioned at the third substrate position and then transferring this substrate to the fourth substrate position;
  a holder moving unit for moving said substrate feed holder and said substrate discharge holder separately in a vertical direction and in an integrated state along the substrate-transportation direction; and
  a substrate holding-and-moving device for releasably holding a substrate, said substrate holding-and-moving device capable of moving, while holding the substrate, to a substrate mounting region of the mounting unit, for mounting of a component onto the substrate, and also to the third substrate position, and said substrate holding-and-moving device also capable of moving to the second substrate position.

7. The substrate transportation apparatus according to claim 6, further comprising:
  a control unit for controlling respective holding operations of said substrate feed holder and said substrate discharge holder, a movement operation of said holder moving unit, and a movement operation of said substrate holding-and-moving device, such that
  (i) said substrate discharge holder holds a component-mounted substrate on said substrate holding-and-moving device when positioned at the third substrate position, and then removes said component-mounted substrate from said substrate holding-and-moving device,
  (ii) said substrate holding-and-moving device moves to the second substrate position,
  (iii) said substrate feed holder supplies a substrate to said substrate holding-and-moving device when positioned at the second substrate position,
  (iv) said substrate holding-and-moving device moves from the second substrate position, along with the substrate supplied by said substrate feed holder, to the substrate mounting region, and
  (v) said substrate discharge holder moves, along with the component-mounted substrate held thereby, to the fourth substrate position.

8. The substrate transportation apparatus according to claim 6, wherein
  said substrate holding-and-moving device is operable to move, along with a substrate held thereby, in a direction along the substrate-transportation direction which is along a surface of the substrate, and in a direction substantially perpendicular to the substrate-transportation direction.

9. The substrate transportation apparatus according to claim 6, wherein
  said holder moving unit is operable to change a speed or an acceleration thereof depending on whether or not said substrate discharge holder is in a state of holding a component-mounted substrate, with the speed or acceleration, when said substrate discharge holder is in the state of holding a component-mounted substrate, being less than the speed or acceleration, respectively, when said substrate discharge holder is in a state of not holding a component-mounted substrate.

10. The substrate transportation apparatus according to claim 9, wherein
  the speed of said substrate discharge holder when said substrate discharge holder is in the state of holding a component-mounted substrate is a speed which allows to be prevented displacement, from mounted positions, of components mounted on the component-mounted substrate.

11. The substrate transportation apparatus according to claim 6, wherein
  the first substrate position and the fourth substrate position share an identical height position, and the second substrate position and the third substrate position share an identical height position.

12. The substrate transportation apparatus according to claim 11, wherein
  said holder moving unit comprises
    (i) a feed elevation unit for vertically moving said substrate feed holder, and
    (ii) a discharge elevation unit for vertically moving said substrate discharge holder,
  with said feed elevation unit and said discharge elevation unit being for vertically moving said substrate feed holder and said substrate discharge holder, respectively, such that said substrate feed holder and said substrate discharge holder are separately positionable at each of
    (i) a first height position corresponding to the height position of the first substrate position and the fourth substrate position,
    (ii) a first retreat height position which is higher than the first height position,
    (iii) a second height position corresponding to the height position of the second substrate position and the third substrate position, and
    (iv) a second retreat height position which is higher than the second height position.

13. The substrate transportation apparatus according to claim 12, wherein said feed elevation unit includes first and second cylinder sections, with strokes of said first and second cylinder sections being different from each other, and with the strokes of said first and second cylinder sections being combined so as to achieve vertical movement to the first and second height positions and to the first and second retreat height positions, and said discharge elevation unit includes third and fourth cylinder sections, with strokes of said third and fourth cylinder sections being different from each other, and with the strokes of said third and fourth cylinder sections being combined so as to achieve vertical movement to the first and second height positions and to the first and second retreat height positions.

14. A component mounting apparatus, comprising:

a substrate transportation apparatus; and a mounting unit, wherein said substrate transportation apparatus is for transporting substrates by feeding the substrates to said mounting unit, which is to mount components onto the substrates and offer the substrates as component-mounted substrates, and by discharging the component-mounted substrates from said mounting unit, with said substrate transportation apparatus including (i) a loader unit for loading a substrate along a substrate-transportation direction such that the substrate becomes positioned at a first substrate position, from among the first substrate position, a second substrate position, a third substrate position and a fourth substrate position, with the first, second, third and fourth substrate positions being arranged sequentially next to one another, (ii) an unloader unit for unloading from the fourth substrate position a substrate positioned thereat, (iii) a substrate feed holder for releasably holding the substrate positioned at the first substrate position and then transferring this substrate to the second substrate position, (iv) a substrate discharge holder for releasably holding a substrate positioned at the third substrate position and then transferring this substrate to the fourth substrate position, (v) a holder moving unit for moving said substrate feed holder and said substrate discharge holder separately in a vertical direction and in an integrated state along the substrate-transportation direction, and (vi) a substrate holding-and-moving device for releasably holding a substrate, said substrate holding-and-moving device capable of moving, while holding the substrate, to a substrate mounting region of said mounting unit, for mounting of a component onto the substrate, and also to the third substrate position, and said substrate holding-and-moving device also capable of moving to the second substrate.

15. The component mounting apparatus according to claim 14, wherein said mounting unit comprises a mounting head unit constructed and arranged to hold respective components and mount these held components onto the substrate when the substrate is held by said substrate holding-and-moving device in the mounting region.

* * * * *